US007651311B2

(12) United States Patent
Hashimoto et al.

(10) Patent No.: US 7,651,311 B2

(45) Date of Patent: Jan. 26, 2010

(54) SUBSTRATE CONTAINER OPENER AND OPENER-SIDE DOOR DRIVE MECHANISM THEREOF

(75) Inventors: Yasuhiko Hashimoto, Kobe (JP); Masao Takatori, Kobe (JP)

(73) Assignee: Kawasaki Jukogyo Kabushiki Kaisha, Kobe (JP)

( * ) Notice: Subject to any disclaimer, the term of this patent is extended or adjusted under 35 U.S.C. 154(b) by 17 days.

(21) Appl. No.: 11/889,653

(22) Filed: Aug. 15, 2007

(65) Prior Publication Data

US 2008/0069670 A1 Mar. 20, 2008

(30) Foreign Application Priority Data

Aug. 24, 2006 (JP) ............................ 2006-228361

(51) Int. Cl.
*B65B 69/00* (2006.01)

(52) U.S. Cl. ...................................... 414/411; 414/939

(58) Field of Classification Search ................ 414/217, 414/411, 728, 744.6, 939; 74/98, 110, 55–56, 74/128, 569; 901/15
See application file for complete search history.

(56) References Cited

U.S. PATENT DOCUMENTS 4,501,352 A * 2/1985 Yanagisawa et al. ........ 198/775
5,632,588 A * 5/1997 Crorey et al. ............ 198/468.2
6,053,983 A * 4/2000 Saeki et al. ................. 118/728
6,073,503 A * 6/2000 Matsuno et al. ................ 74/55
6,082,951 A 7/2000 Nering et al.
6,655,423 B2 * 12/2003 Rush et al. .................... 141/98
6,984,839 B2 * 1/2006 Igarashi et al. ......... 250/559.33
7,102,124 B2 * 9/2006 Bacchi et al. ............... 250/239
2004/0123678 A1 * 7/2004 Arai ...................... 73/862.324
2006/0182560 A1 * 8/2006 Mitsuyoshi ................. 414/411
2007/0009345 A1 * 1/2007 Hall et al. .............. 414/222.01
2008/0069670 A1 * 3/2008 Hashimoto et al. .......... 414/219

FOREIGN PATENT DOCUMENTS

JP A 2002-170860 6/2002
JP A 2002-359273 12/2002
JP A-2003-303869 10/2003
JP 2007335475 A * 12/2007
KR 1020010058722 A 7/2001
KR 1020060061935 A 6/2006

* cited by examiner

*Primary Examiner*—Saúl J Rodríguez
*Assistant Examiner*—Joshua I Rudawitz
(74) *Attorney, Agent, or Firm*—Oliff & Berridge PLC

(57) ABSTRACT

In this invention, a movable body movable in forward and backward directions and a connector fixed to an opener-side door are connected with each other by link members so as to constitute a parallel link mechanism, such that they can be angularly displaced relative to each other. Link member angular displacement means controls the angular displacement of each link member relative to the movable body to be in a predetermined angular position, corresponding to the position of the movable body along the forward and backward directions. Reciprocation of the movable body in the forward and backward directions by movable body drive means moves the opener-side door in the forward and backward directions as well as in the upward and downward directions, thereby opening an opener-side opening. Since the movable body is moved only in the forward and backward directions, and necessity of moving and guiding the movable body in the upward and downward directions can be eliminated, the substrate container opener can be downsized, and a space provided below a FOUP supporting portion can be utilized effectively.

9 Claims, 20 Drawing Sheets

ACCESSIBLE
INACCESSIBLE
26
28a
97
93
25
92
85
84
91
95
31
75
126
128a
197
193
125
131
188
76
Z
Z1
Z2
X
X1
X2

26
28a
25
31
95
84 85
91
92
93
97
75
Z
Z1
Z2
X
X1
X2

126
128a
125
131
188
193
197
76
Z
Z1
Z2
X
X1
X2

Z
Z1
Z2
X1
X2
X
C1
C2
98

C1
C2
98

C1
C2
98

C1
C2
98

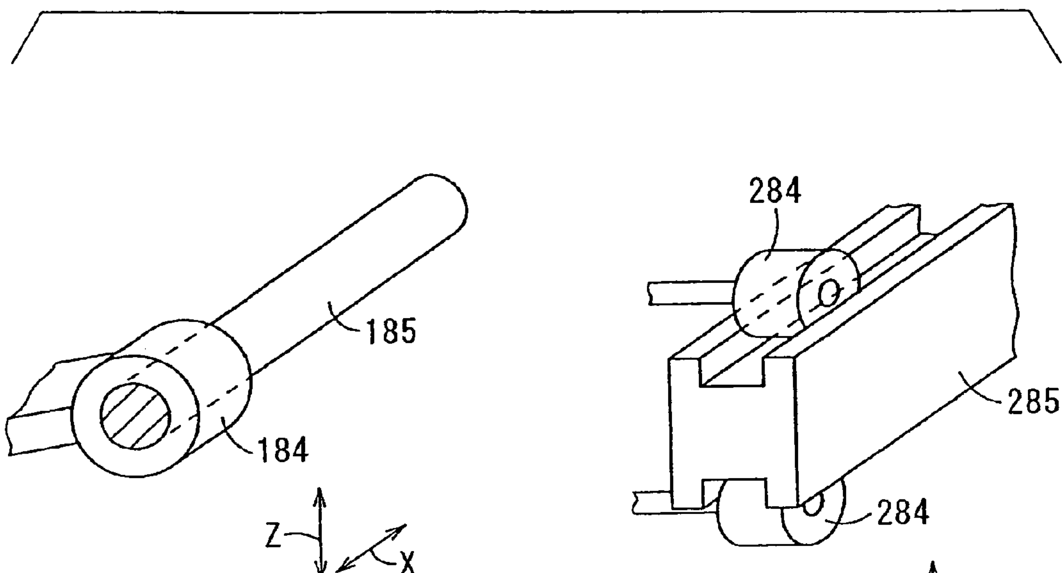
FIG. 18(1)
FIG. 18(2)
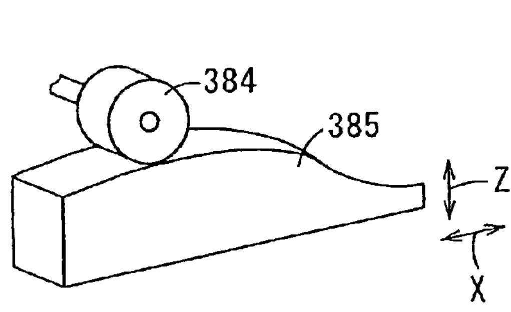
FIG. 18(3)
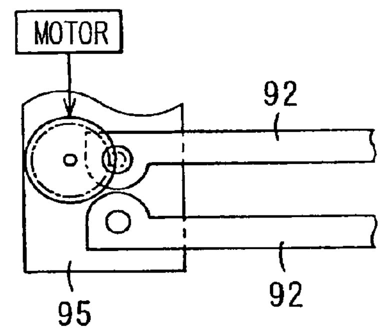
FIG. 18(4)

SUBSTRATE CONTAINER OPENER AND OPENER-SIDE DOOR DRIVE MECHANISM THEREOF

CROSS REFERENCE TO RELATED APPLICATIONS

This application is based upon the prior Japanese Patent Application No. 2006-228361 filed on Aug. 24, 2006, the entire contents of which are incorporated herein by reference.

BACKGROUND OF THE INVENTION

1. Field of the Invention

The present invention relates to a part of a substrate transfer apparatus for carrying in and carrying out a substrate in a substrate processing equipment, and particularly to an equipment front end module (EFEM) which is a substrate transfer apparatus of semiconductor processing equipment.

2. Background Art

FIG. 20 is a section showing a semiconductor processing equipment 1 of a related art, which is partly cut away. The semiconductor processing equipment 1 is configured to include a wafer processing apparatus 2 and a wafer transfer apparatus 3. A space defined in the semiconductor processing equipment 1 is filled with a predetermined atmospheric gas. In this manner, attachment of dust particles floating in the air to each wafer 4 to be processed can be prevented. Each semiconductor wafer 4 is carried toward the semiconductor processing equipment 1 while contained in a front opening unified pod (FOUP) 5 which serves as a substrate container.

The wafer transfer apparatus 3 takes out a wafer 4 before processed from the FOUP 5, and transfers the wafer 4 taken out from the FOUP 5 through an interface space 9, so as to feed it to the wafer processing apparatus 2. Alternatively, the wafer transfer apparatus 3 takes out another wafer 4 already processed from the wafer processing apparatus 2, and transfers the wafer 4 taken out from the wafer processing apparatus 2 through the interface space 9, so as to return it into the FOUP 5. Specifically, the wafer transfer apparatus 3 includes a FOUP opener 6 (hereinafter, referred to as an opener 6), a robot 7, and interface space-constituting walls defining the interface space 9. A space 12 in the FOUP and the interface space 9 are each airtightly closed against an external space 13, as such they can be maintained to have very few dust particles contained therein.

The opener 6 includes a front face wall 8 having an opener-side opening formed therein such that each wafer 4 can pass therethrough, a FOUP supporting portion 11 for supporting the FOUP 5 in the exterior of the interface space 9, and an opener-side door adapted to open and close the front face wall 8. The opener 6 drives the FOUP-side door of the FOUP 5 and the opener-side door to be displaced, while preventing the outside air from entering inside, so as to have the space 12 in the FOUP and the interface space 9 be in communication with each other. In this state, the robot 7 carries each wafer 4 from the FOUP 5 to the wafer processing apparatus 2 as well as carries the wafer 4 from the wafer processing apparatus 2 to the FOUP 5. The opener 6 can also drive the FOUP-side door and the opener-side door to be displaced, so as to block the communication between the space 12 in the FOUP 5 and the interface space 9. In this way, these spaces 9, 12 are each airtightly closed against the outside air, thereby completely separating the FOUP 5 from the semiconductor processing apparatus 1. For instance, such a related art is disclosed in JP 2002-170860 A and JP 2002-359273 A.

FIGS. 21(1) to 21(3) are sections showing the related art opener 6. Along with progress of operations in the order depicted by FIGS. 21(1) to 21(3), the space 12 in the FOUP can be in communication with the interface space 9. As shown in FIGS. 21(1) to 21(3), the opener 6 includes a drive section 18 adapted to drive the opener-side door 14 and the FOUP-side door 15 to be displaced in upward and downward directions Z as well as in horizontal directions X, so as to open and close the FOUP 5. The drive section 18 is configured to include a first drive system 16 adapted to move each door 14, 15 in the upward and downward directions Z, and a second drive system 17 adapted to move each door 14, 15 in the horizontal directions X. The drive section 18 is located below the FOUP supporting portion 11.

The first drive system 16 includes a first movable portion 16*a* which can be moved in the upward and downward directions Z in a space defined below the FOUP supporting section 11, a first drive source 16*b* for driving the first movable portion 16*a* to be displaced in the upward and downward directions Z, and a ball screw mechanism 16*c* adapted to transmit power from the first drive source 16*b* to the first movable portion 16*a*. The ball screw mechanism 16*c* includes a screw shaft extending in the upward and downward directions, and is connected with the first movable portion 16*a*, via an engagement portion which can be engaged with the screw shaft. With rotation of the screw shaft due to the first drive source 16*b*, the first movable portion 16*a* can be moved in the upward and downward directions Z together with the engagement portion.

The second drive system 17 includes a connecting portion 17*a* which is fixed to the opener-side door 14, and a second drive source 17*b* for driving the connecting portion 17*a* to be displaced in the horizontal directions X. The second drive system 17 is mounted on the first movable portion 16*a* such that it can be moved in the upward and downward directions Z together with the first movable portion 16*a*. The connecting portion 17*a* is driven to be displaced, in the horizontal directions X, by the second drive source 17*b*, and is also driven to be displaced, in the upward and downward directions Z, by the first drive source 16*b*, along with the first movable portion 16*a*. In this way, the opener-side door 14 fixed to the connecting portion 17*a* and the FOUP-side door 15 held by the opener-side door 14 are also driven to be displaced in the upward and downward directions Z as well as in the horizontal directions X.

In the case of bringing the space 12 in the FOUP and the interface space 9 into communication with each other, as shown in FIG. 21(1), the opener-side door 14 is driven to remove the FOUP-side door 15 from the FOUP main body and hold the removed FOUP-side door 15. Subsequently, as shown in FIG. 21(2), the connecting or hand portion 17*a* is driven to be moved in the horizontal directions X by the second drive source 17*b*. Thereafter, as shown in FIG. 21(3), the hand portion 17*a* is moved downward by the first drive source 16*b*. In the case of terminating the communication between the space 12 in the FOUP and the interface space 9, procedures, which are reverse to those for bringing the space 12 in the FOUP and the interface space 9 into communication with each other, are carried out.

In the related art opener 6, since the drive section 18 adapted to open and close the FOUP 5 is located below the FOUP supporting portion 11, the opener 6 should be formed in a larger size. In addition, the space below the FOUP supporting portion 11 can not be utilized effectively. Such problems also occur, in the same manner, in a substrate container opener in which substrates other than semiconductor wafers are contained.

Therefore, it is an object of the present invention to provide a substrate container opener, which can be downsized and provide a space effectively utilizable and located below the container supporting portion.

SUMMARY OF THE INVENTION

The present invention is an opener-side door drive mechanism, constituting a part of a substrate container opener for opening and closing a substrate container, the substrate container including a container main body configured to open in a preset front face direction and having a space for containing substrates therein, and a container-side door formed to be attached to and detached from the container main body and adapted to close an opening of the space for containing the substrates therein while being attached to the container main body, the opener-side door drive mechanism being configured to drive and displace the opener-side door capable of holding the container-side door which is removed from the container main body, the opener-side door drive mechanism comprising:

(a) a movable body configured to be movable in forward and backward directions X including a forward direction X1 corresponding to the front face direction with respect to the container main body positioned and supported by a container supporting portion constituting a part of the substrate container opener, and a backward direction X2 reverse to the forward direction X1;

(b) movable body drive means configured to drive and displace the movable body in the forward and backward directions X;

(c) a connector fixed to the opener-side door;

(d) a plurality of link members constituting a parallel link mechanism by connecting the movable body with the connector, wherein the connector is connected with the movable body such that the connector can be relatively and angularly displaced about an angular displacement axis L which extends vertically or substantially vertically to the forward and backward directions X; and (e) link member angular displacement means configured to angularly displace each of the link members relative to the movable body to predetermined angular positions corresponding to positions of the movable body along the forward and backward directions, the link member angular displacement means being configured to:

(e1) control the angular displacement of the link members relative to the movable body, such that components of transfer direction of the connector include at least components of the forward and backward directions X, while the movable body is moved in the forward and backward directions X, between a closing position in which the movable body is located while the container-side door held by the opener-side door closes the opening of the container main body and a detaching position in which the movable body is moved by a preset distance A in the forward direction X1 from the closing position; and (e2) angularly displace the link members relative to the movable body along with an movement of the movable body, such that components of the transfer direction of the connector include at least directional components vertical to the forward and backward directions X, while the movable body is moved in the forward and backward directions X over an evacuating region located in the forward direction X1 relative to the detaching position.

According to this invention, by connecting the movable body and the connector with each other via the plurality of link members constituting a parallel link mechanism, the connector and the opener-side door fixed to the connector can be moved while keeping their attitudes the same.

Due to the control of the angular displacement of the link members relative to the movable body by using the link member angular displacement means, along with the movement of the movable body in the forward and backward directions X, while the movable body is moved between the closing position and the detaching position, the transfer direction of the connector includes at least components of the forward and backward directions X. Thus, the opener-side door fixed to the connector is moved in the forward and backward directions together with the container-side door which is held by the opener-side door. While the movable body is moved from the closing position to the detaching position in the forward direction X1, the container-side door held by the opener-side door is detached from the container main body in the forward direction X1 and moved away from the container main body. Alternatively, while the movable body is moved from the detaching position to the closing position in the backward direction X2, the container-side door held by the opener-side door is moved toward the container main body in the backward direction X2 and closes the opening of the container main body.

While the movable body is moved over the evacuating region, the link member angular displacement means angularly displaces the link members relative to the movable body, along with the movement of the movable body in the forward and backward directions X, the transfer direction of the connector includes at least directional components vertical to the forward and backward directions X. Thus, the opener-side door fixed to the connector is moved in the vertical direction together with the container-side door which is held by the opener-side door. While the movable body is moved over the evacuating region in the forward direction X1, the container-side door held by the opener-side door is moved away from the container main body in the direction vertical to the forward and backward directions X, thereby opening the container main body. Alternatively, while the movable body is moved over the evacuating region in the backward direction X2, the container-side door held by the opener-side door approaches the container main body in the direction vertical to the forward and backward directions X so as to face the container main body.

As described above, in the present invention, the container-side door held by the opener-side door can be displaced in the forward and backward directions X as well as can be angularly displaced about the angular displacement axis L of the movable body. Thus, the container main body can be opened and closed by driving the container-side door in the two directions in a plane vertical to the angular displacement axis L.

As mentioned above, according to the present invention, with the movement of the movable body, in the forward and backward directions X due to the movable body drive means, the container-side door held by the opener-side door can be moved both in the forward and backward directions X and in the direction vertical to the forward and backward directions X. Thus, the container-side door can be moved close to or away from the container main body so as to open and close the container main body. It is noted that the forward and backward directions X in which the movable body is moved are those parallel to the front face direction in which the space for containing substrates is opened, with respect to the container main body supported by the container supporting portion. In this case, the movable body can be moved in the forward and backward directions X while being located in the vicinity of the substrate container supported by the container supporting portion. Therefore, there is no need for providing a mechanism for moving the movable body in a region spaced away from the container supporting portion. Accordingly, in the present invention, the opener-side door drive mechanism can be located in the vicinity of the container supporting portion, thereby to downsize the substrate container opener. In addition, a space provided away from the container supporting portion for supporting the substrate container in the substrate container opener can be utilized effectively.

Preferably, in the present invention, the link member angular displacement means is configured to:

keep angles of the link members relative to the movable body constant or substantially constant, while the movable body is moved between the closing position and the detaching position; and increase the angles of the link members relative to the movable body, corresponding to the movement of the movable body in the forward direction X1, and decrease the angles of the link members relative to the movable body, corresponding to the movement of the movable body in the backward direction X2, while the movable body is moved over the evacuating region.

According to this invention, the angular displacement of each link member relative to the movable body can be controlled by using the link member angular displacement means, while the movable body is moved between the closing position and the detaching position. Due to the control of the angular displacement of each link member, when the connector is moved corresponding to the movement of the movable body, all or most of the components of the transfer direction of the connector are components of the forward and backward directions X. Therefore, the container-side door held by the opener-side door is also moved in the transfer direction including components, all or most of which are components of the forward and backward directions X.

While the movable body is moved over the evacuating region in the forward direction X1, the components of the forward and backward directions X included in the components of the transfer direction of the container-side door can be reduced, by increasing the angle of each link member relative to the movable body, corresponding to the movement of the movable body. Alternatively, while the movable body is moved over the evacuating region in the backward direction X2, the components of the forward and backward directions X included in the components of the transfer direction of the container-side door can be reduced, by decreasing the angle of each link member relative to the movable body, corresponding to, the movement of the movable body. Thus, while the movable body is moved over the evacuating region in the forward and backward directions X, the container-side door can be moved close to or away from the container main body in the vertical or substantially vertical direction.

As mentioned above, according to the present invention, all or most of components of the transfer direction of the container-side door include components of the forward and backward directions X, while the movable body is moved between the closing position and the detaching position. Consequently, in the case where the container-side door is moved close to or away from the container main body in the forward and backward directions X, interference between the opening of the container main body and/or front face wall formed in the substrate container opener and the container-side door can be prevented, as such smoothly bringing the container-side door close to or away from the container main body.

While the movable body is moved over the evacuating region in the forward and backward directions X, the container-side door is moved close to or away from the container main body vertically or substantially vertically. Thus, undesired movement of the container-side door in the forward and backward directions X can be suppressed, thus reducing the movable range of the container-side door in the forward and backward directions X, thereby to lessen the dimension in the forward and backward directions X, which is required for opening and closing the container main body. Consequently, interference due to the container-side door and the opener-side door with the other devices or machines located in the substrate transfer apparatus, for example, robots for carrying substrates, can be prevented.

Preferably, in the present invention, the forward and backward directions X and the angular displacement axis L extend horizontally or substantially horizontally. The link member angular displacement means is configured to angularly displace the link members in a downward direction relative to the movable body, corresponding to the movement of the movable body over the evacuating region in the forward direction X1, and angularly displace the link members in an upward direction relative to the movable body, corresponding to the movement of the movable body over the evacuating region in the backward direction X2.

According to this invention, since the forward and backward directions are defined to extend horizontally or substantially horizontally, the connector can be moved along a track extending horizontally or substantially horizontally, while the movable body is moved between the closing position and the detaching position. Due to the angular displacement in the downward direction of each link member relative to the movable body corresponding to the movement of the movable body over the evacuating region in the forward direction X1, the connector can be moved in the downward direction along a track extending vertically or substantially vertically, while the movable body is moved over the evacuating region in the forward direction X1. In addition, due to the angular displacement in the upward direction of each link member relative to the movable body corresponding to the movement of the movable body over the evacuating region in the backward direction X2, the connector can be moved in the upward direction along a track extending vertically or substantially vertically, while the movable body is moved over the evacuating region in the backward direction X2.

As described above, in the present invention, upon opening the container main body, the container-side door is moved in the forward direction X1 along a horizontal or substantially horizontal track, and is then moved in the downward direction along a vertical or substantially vertical track. Alternatively, upon closing the container main body, the container-side door is moved in the upward direction along a vertical or substantially vertical track, and is then moved in the backward direction X2 along a horizontal or substantially horizontal track.

As mentioned above, according to the present invention, in the case of opening the container main body, the container-side door is initially moved away from the container main body, drawing a horizontal or substantially horizontal track, and is then transferred away from the container main body, drawing a vertical or substantially vertical track. In the case of closing the main body, the container-side door is initially moved close to the container main body, drawing a vertical or substantially vertical track, while being spaced away from the container main body, and is then in contact with the container main body, drawing a horizontal or substantially horizontal track. As described above, by opening the container main body by moving the container-side door in the downward direction below the container main body, the air stream can be controlled to flow from above to below even though it is disturbed upon opening and closing the container. Therefore, possibility of attachment of dust particles to the substrate, container main body and/or robot can be reduced, thus preventing contamination of the substrate upon carrying in and carrying out it.

Preferably, in the present invention, the movable body drive means, the link member angular displacement means and the movable body are supported by the container supporting portion.

According to this invention, since the movable body drive means, the link member angular displacement means and the movable body can be supported by using the container supporting portion constituting a part of the substrate container opener, the container supporting portion can also be used as a supporting portion for supporting the opener-side door drive mechanism including the movable body drive means, the link member angular displacement means and the movable body. Therefore there is no need for separately providing a portion for supporting each components of the opener-side door drive mechanism, thereby to reduce the number of components.

As mentioned above, according to the present invention, since the movable body drive means, link member angular displacement means and movable body can be supported by the container supporting portion, there is no need for separately providing portions for supporting the movable body drive means and movable body, thereby to reduce the number of components of the substrate container opener. Thus, the substrate container opener can be downsized, the structure can be simplified, and the manufacturing cost of the substrate container opener can be reduced. For example, due to the configuration in which the respective components for constituting the opener-side door drive mechanism can be supported by the container supporting portion, there is no need for having the front face wall formed in the substrate container opener to fix and support the respective components of the opener-side door drive mechanism. Therefore, the front face wall can be downsized, the rigidity required for the front face wall can be lowered, and the manufacturing cost of the substrate container opener can be reduced.

Preferably, in the present invention, the link member angular displacement means comprises:

an engaging portion provided on at least any one of the link members; and a controlling portion configured to be engaged with the engaging portion so as to control angular positions of the engaging portion relative to the movable body corresponding to the positions of the movable body along the forward and backward directions.

According to this invention, due to the engagement of the engaging portion with the controlling portion, the angular displacement of each link member about the angular displacement axis L set at the movable body can be controlled, corresponding to each position of the movable body in the forward and backward directions. For instance, when the movable body is in a first position in the forward and backward directions, the angular displacement is controlled in an angular position about the angular displacement axis, corresponding to the first position in the forward and backward directions, with the engaging portion being engaged with the controlling portion. Otherwise, for example, when the movable body is in a second position in the forward and backward directions, the angular displacement is controlled in an angular position about the angular displacement axis, corresponding to the second position in the forward and backward directions, with the engaging portion being engaged with the controlling portion. In this manner, since the link member angular displacement means is configured to include the engaging portion and the controlling portion, the angular displacement of each link member relative to the movable body can be controlled to be a desired value, along with the movement of the movable body in the forward and backward directions, without requiring a separate drive source.

As mentioned above, according to the present invention, since the link member angular displacement means is configured to include the engaging portion and the controlling portion, the angular displacement of each link member relative to the movable body can be controlled without requiring a separate drive source. Consequently, only by moving the movable body in the forward and backward directions X due to the movable body drive means, each link member can be angularly displaced along with the movement of the movable body. Therefore, the configuration of the substrate container opener can be further simplified.

Preferably, in the present invention, the movable body drive means constitutes a part of the substrate container opener, and is configured to drive and displace the movable body in the forward and backward directions X, by utilizing a power of substrate container drive means configured to drive and displace the substrate container supported by the container supporting portion in the forward and backward directions X.

According to this invention, the substrate container drive means moves the substrate container in the forward and backward directions X via the table portion or the like. The movable body drive means moves the movable body in the forward and backward directions X. The substrate container drive means and the movable body drive means are common in moving an object in the forward and backward directions. Thus, by providing a switching means for switching the power transmission to the table portion or to the movable body in order to move it in the forward and backward directions X, the substrate container drive means can also be used as the movable body drive means.

As mentioned above, according to the present invention, the provision of the movable body drive means by using the substrate container drive means for moving the substrate container in the forward and backward directions X via the table portion or the like can eliminate necessity of using two drive sources, i.e., a drive source for driving and displacing the movable body and a drive source for driving and displacing the substrate container. Namely, both of the substrate container drive means and the movable body drive means can be realized by using a single drive source, thereby the number of the drive sources in the substrate container opener can be reduced. Thus, the substrate container opener can be downsized, as well as the structure can be simplified.

The present invention is a substrate container opener comprising:

a front face wall having an opener opening formed to extend therethrough in a thickness direction;

a container supporting portion configured to locate and support a container main body in an attaching position where an opening of the container main body is in contact with the opener opening in the front face wall in a circumferential direction;

an opener-side door including an attaching and detaching mechanism which can attach and detach a container-side door relative to the container main body located and supported in the attaching position by the container supporting portion, the opener-side door further including a holding mechanism capable of holding the container-side door removed from the container main body, and the opener-side door being configured to close the opener opening; and the opener-side door drive mechanism mentioned above, which can drive and displace the opener-side door holding the container-side door.

According to this invention, since the opener-side door drive mechanism of the substrate container opener has the configuration described above, the substrate container opener can be realized, which can open and close the container main body by moving the movable body in the forward and backward directions X.

As mentioned above, according to the present invention, the substrate container opener can be downsized due to the opener-side door drive mechanism as described above. In addition, a space provided away from the container supporting portion in the direction vertical to the forward and backward directions X can be utilized effectively. Furthermore, the front face wall to be closely contacted with the substrate container to be located and supported in the substrate container opener can be downsized, as such the manufacturing cost of the substrate transfer apparatus can be reduced.

The present invention is a substrate transfer apparatus configured to transfer a substrate relative to a substrate manufacturing apparatus for processing the substrate in a predetermined atmosphere, the substrate transfer apparatus comprising the substrate container opener mentioned above.

According to this invention, since the opener-side door drive mechanism of the substrate container opener has the configuration described above, the substrate transfer apparatus, on which the substrate container opener is mounted, can be realized, the substrate container opener being able to open and close the container main body, by moving the movable body in the forward and backward directions X.

As mentioned above, according to the present invention, since the substrate container opener having the opener-side door drive mechanism described above is mounted on the substrate transfer apparatus, downsizing due to the downsizing of the substrate container opener can be realized. In addition, a space provided away from the container supporting portion in the direction vertical to the forward and backward directions X can be utilized effectively.

BRIEF DESCRIPTION OF THE DRAWINGS

The above and other objects, features and advantages of the present invention will become more apparent from the following description taken in connection with the accompanying drawings, in which:

FIGS. 18(1) to 18(4) are diagrams showing examples of a part of a link member angular displacement means 91 of another embodiment;

DESCRIPTION OF THE PREFERRED EMBODIMENTS

Referring to FIGS. 1 to 4, the semiconductor processing equipment 20 provides a predetermined process to each semiconductor wafer 24 which is a substrate to be processed. For example, as the process to be provided to the semiconductor wafer 24, various processes, including heating, impurity doping, film forming, lithography, washing or flattening may be included. The semiconductor processing equipment 20 performs the aforementioned processes in a processing space 30 filled with a predetermined atmospheric gas having adequate cleanliness. Wafers 24 are carried into the semiconductor processing equipment 20 while being contained in large numbers in a substrate container 25 referred to as a front opening unified pod (FOUP) 25.

Figure 4:
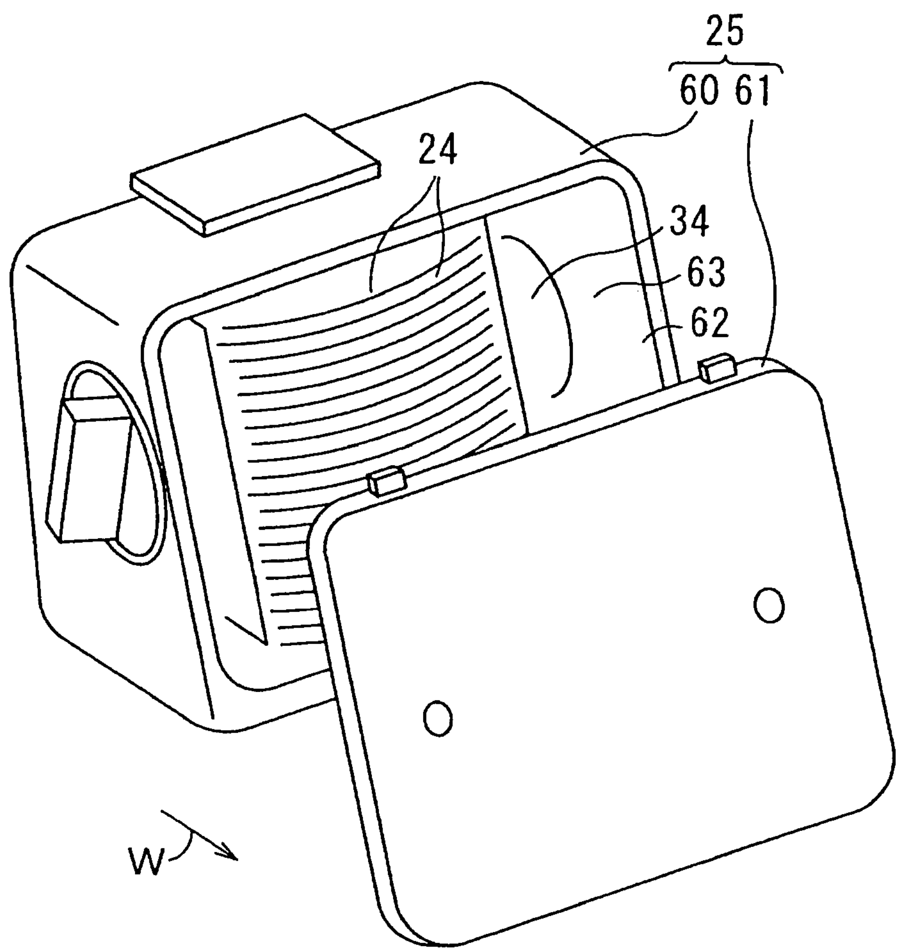
FIG. 4 is a perspective view showing a FOUP 25.

As shown in FIG. 4, the FOUP 25 is configured to include a FOUP main body 60, which is a container main body in which the wafers 24 are contained, and a FOUP-side door 61 as a container-side door which can be attached to and detached from the FOUP main body 60. The FOUP main body 60 is formed into a generally box-like shape which opens in a preset front face direction W, and in which a FOUP internal space 34 is defined as a space for containing the wafers. In the FOUP main body 60, a FOUP-side opening 62 is formed to be exposed in the front face direction W. With the FOUP-side opening 62, a FOUP-side opening 63 is further defined as a region of the FOUP internal space 34 arranged in the front face direction W. The FOUP-side door 61 is formed to have a plate-like shape, and is configured to be attached to and detached from the FOUP main body 60. When the FOUP-side door 61 is attached to the FOUP main body 60, it is in contact with the FOUP-side opening 62 over its periphery, as such closing the FOUP-side opening 62. When the FOUP-side door 61 is removed from the FOUP main body 60, the FOUP-side door 61 is spaced away from the FOUP-side opening 62, thus opening the FOUP-side opening 62.

Due to attachment of the FOUP-side door 61 to the FOUP main body 60, the FOUP internal space 34 formed in the FOUP main body 60 is closed airtightly against an external space 33, as such invasion of contaminant from the external space 33 into the FOUP internal space 34 can be prevented. Accordingly, if the FOUP-side door 61 is attached to the FOUP main body 60 while the FOUP internal space 34 is in a cleaned state, the FOUP internal space 34 can be maintained in such a cleaned state. Contrary, when the FOUP-side door 61 is removed from the FOUP main body 60, the wafer 24 can be contained in the FOUP internal space 34, as well as the wafers 24 contained in the FOUP internal space 34 can be taken out therefrom.

Figure 1:
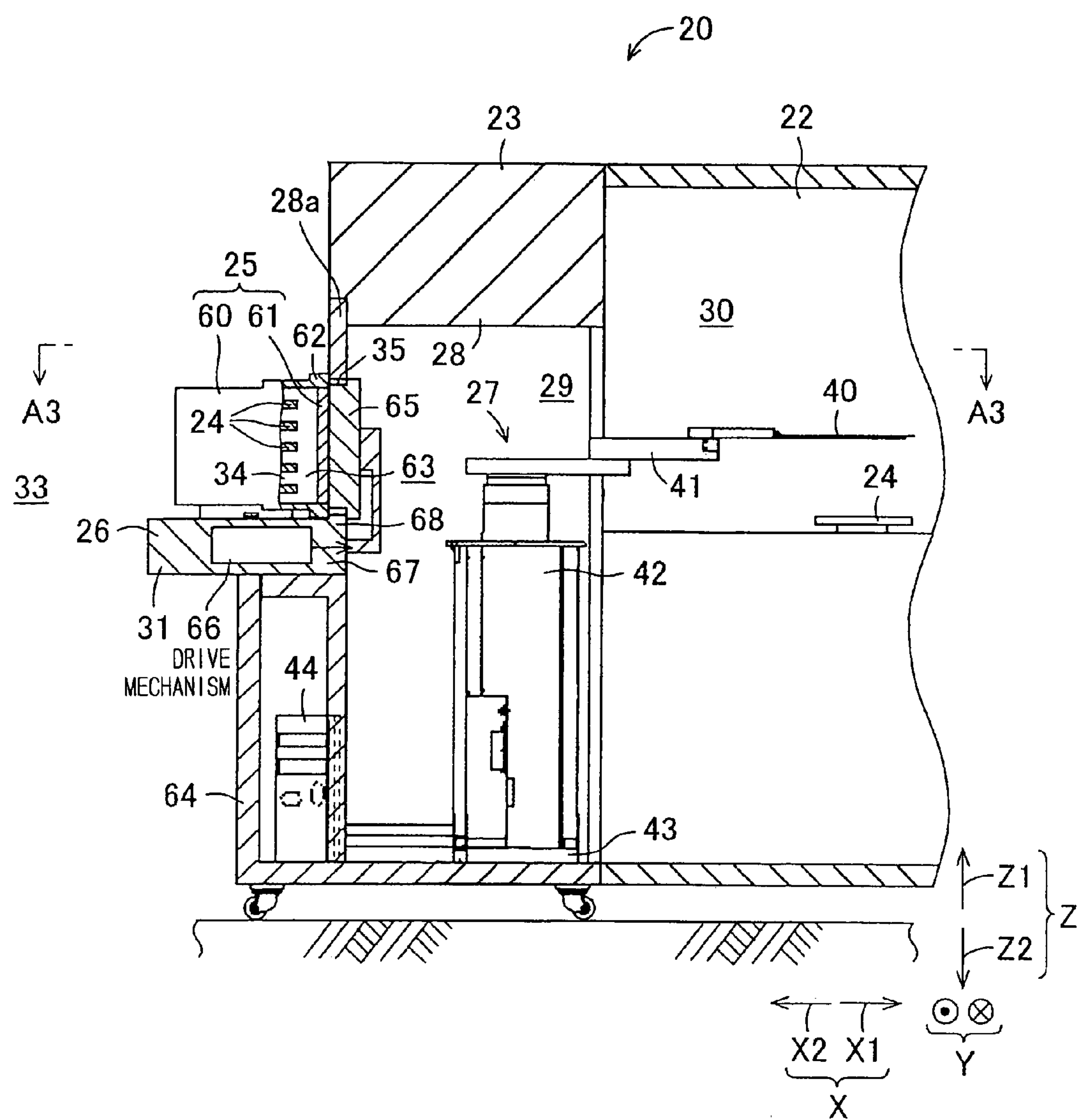
FIG. 1 is a section showing semiconductor processing equipment 20, which is an embodiment of the present invention and is partly cut away.
Figure 2:
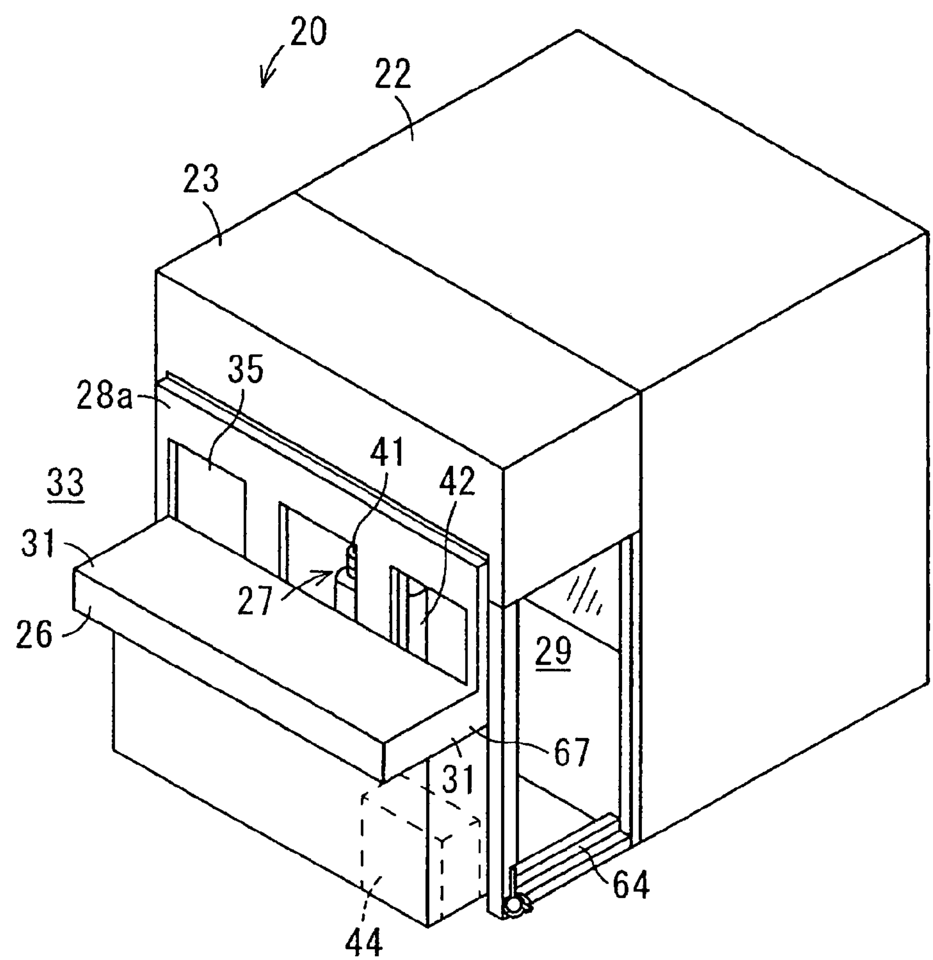
FIG. 2 is a perspective view showing the semiconductor processing equipment 20.
Figure 3:
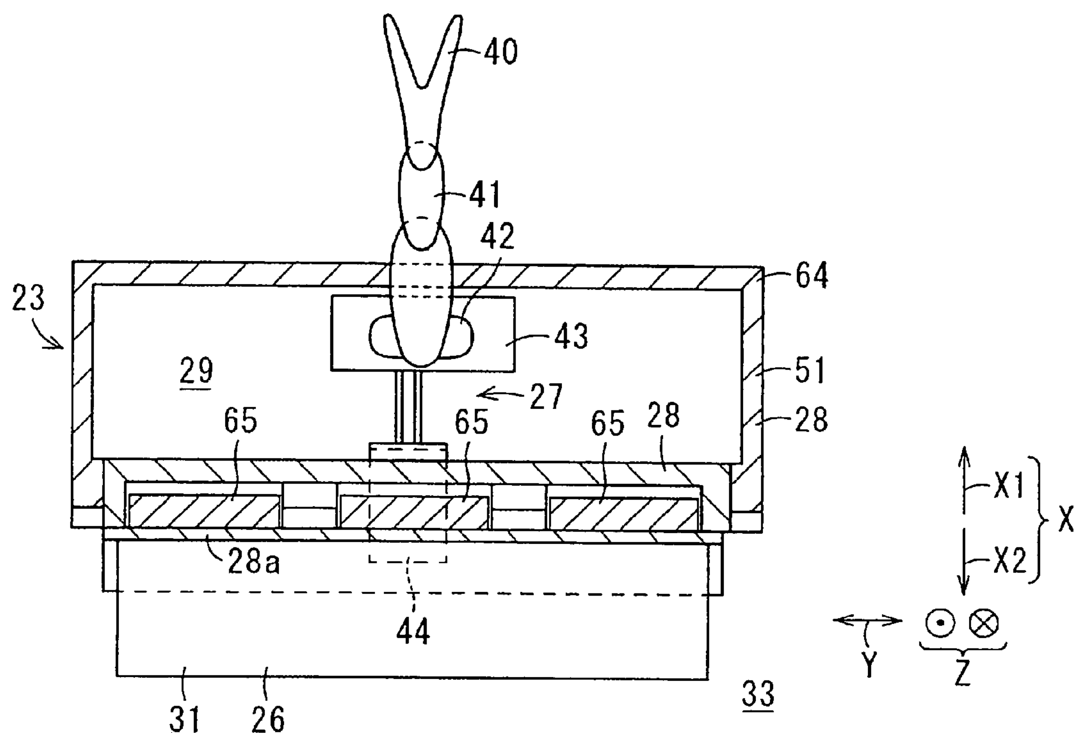
FIG. 3 is a section taken along line A3-A3 of FIG. 1, showing the semiconductor processing equipment 20.

As shown in FIGS. 1 to 3, the semiconductor processing equipment 20 is configured to include a wafer processing apparatus 22 and a wafer transfer apparatus 23. The wafer processing apparatus 22 provides the predetermined process described above to each wafer 24 in the processing space 30. In addition to a processing apparatus main body adapted to provide a process to each wafer 24, the wafer processing apparatus 22 includes a plurality of processing space constituting walls for constituting the processing space 30, a carrier adapted to carry each wafer 24 in the processing space 30, and a controller adapted to control the atmospheric gas filled in the processing space 30.

The wafer transfer apparatus 23 is configured to take out each unprocessed wafer 24 from the FOUP 25 and supply it into the wafer processing apparatus 22, as well as configured to take out each processed wafer 24 from the wafer processing apparatus 22 and place it in the FOUP 25. The wafer transfer apparatus 23 is called equipment front end module (EFEM), and serves as an interface for transferring each wafer 24 between the FOUP 25 and the wafer processing apparatus 22, in the wafer processing apparatus 22. In this case, the wafer 24 passes through an interface space 29 filled with a predetermined atmospheric gas and having high cleanliness, during its movement between the FOUP internal space 34 and the processing space 30 of the wafer processing apparatus 22.

The wafer transfer apparatus 23 includes a plurality of interface space constituting walls 28 for constituting the interface space 29, a frame 64, a wafer carrying robot 27 which is located in the interface space 29 and capable of carrying each wafer, a FOUP opener 26 (hereinafter, referred to as an opener 26) adapted to open and close the FOUP 25, and a controller adapted to control an atmospheric gas filled in the interface space 29.

The interface space constituting walls 28 surrounds the interface space 29 to prevent the outside air from entering the interface space 29 from the external space 33. To the frame 64, carrier elements required for carrying each wafer 24 are fixed respectively. In this embodiment, three openers 26 and one robot 27 are fixed to the frame 64.

Each FOUP 25 is intended to serve as a mini-environmental substrate container configured to provide a clean environment for the locally cleaning technique. Each opener 26 serves as an opening and closing apparatus for opening and closing each FOUP 25 and is referred to as the so-called FOUP opener. A part of the construction of the FOUP 25 and opener 26 is prescribed, for example, in the SEMI (Semiconductor Equipment and Materials International) standard. In this case, for example, each FOUP 25 and each opener 26 follow the specifications, including E47.1, E15.1, E57, E62, E63, E84, of the SEMI standard. It should be noted that even though the construction of the FOUP 25 and opener 26 does not fall within the SEMI standard, such construction may also be included in this embodiment.

Each opener 26 is configured to include a front face wall **28*a*, an opener-side door 65, a FOUP supporting portion 31, an opener-side door drive mechanism 66, and a base 67. The FOUP supporting portion 31 is located in the external space 33 which is outside the interface space 29, and is adapted to support each FOUP 25 carried by a robot or a worker. In this embodiment, the FOUP supporting portion 31 supports the FOUP 25 from below, such that the front face direction W set in the FOUP 25 is horizontal. The FOUP supporting portion 31 is configured to drive the FOUP 25 to be displaced in the front face direction W, while supporting it thereon, and carry and support the FOUP 25** in a predetermined wafer transferring position.

Hereinafter, the front face direction set in the FOUP 25 supported on the FOUP supporting portion 31 will be referred to as a forward direction X1, and the direction reverse to the forward direction X1 will be referred to as a backward direction X2. In addition, the expression including both of the forward direction X1 and the backward direction X2 will be referred to as the forward and backward directions X. The forward and backward directions will be designated by Z, and the directions which are vertically to both of the forward and backward directions X and the upward and downward directions Z will be referred to as left and right directions Y.

The front face wall **28*a* is a plate-like member constituting a part of the interface space constituting walls 28. Across the front face wall 28*a*, the space defined in the forward direction X1 corresponds to the interface space 29, and the space defined in the backward direction X2 corresponds to the external space 33. The front face wall 28*a* is located in the forward direction X1 relative to the FOUP 25 supported on the FOUP supporting portion 31, so as to face the FOUP-side opening 62. In this embodiment, the front face wall 28*a* extends in the upward direction Z1 vertically to a mounting face on which the FOUP 25 is mounted to the FOUP supporting portion 31** as well as extends vertically to the forward and backward directions X.

The front face wall **28*a* includes opener-side openings 68 each providing an opener-side aperture 35 extending through the thickness. The periphery of each opener-side opening 68 is in contact with the periphery of the FOUP-side opening 62 of each corresponding FOUP 25 located and supported in the wafer transferring position. In this manner, entering of the outside air into the FOUP internal space 34 and interface space 29 via a gap between the front face wall 28*a* and the FOUP-side opening 62 can be prevented, while the FOUP 25** is located in the wafer transferring position.

The opener-side aperture 35 is formed to have a sectional shape, vertical to the forward and backward directions X, which is substantially the same as that of the FOUP-side door 61 and greater than the FOUP-side door 61. Accordingly, the FOUP-side door 61 removed from the FOUP main body 60 can be passed through the opener-side aperture 35 in the forward and backward directions X without interfering with the opener-side opening 68.

The opener-side door 65 is configured to be able to attach and detach the FOUP-side door 61 relative to the FOUP main body 60 as well as configured to be able to hold the FOUP-side door 61 removed from the FOUP main body 60. The opener-side door 65 is formed into a generally plate-like shape and closes each opener-side aperture 35 by abutting the periphery around the opener-side opening 68 formed in the front face wall **28*a*. The opener-side door 65 opens each opener-side aperture 35 when it is moved away from the opener-side opening 68 formed in the front face wall 28*a***.

The opener-side door drive mechanism 66 drives the opener-side door 65 to be displaced in the forward and backward directions X as well as in the upward and downward directions Z vertical to the forward and backward directions X. With the drive for displacing the opener-side door 65 by the opener-side door drive mechanism 66, the FOUP-side door 61, which is held by the opener-side door 65, can be driven to be displaced together with the opener-side door 65. In this manner, the FOUP-side door 61 can be moved close to and away from the FOUP main body 60, thereby to open and close each FOUP 25 located in the wafer transferring position. The base 67 of each opener 26 is fixed to the frame 64. Assuming that a portion of the opener 26 excluding the base 67 is an opener main body, the opener main body is fixed to the frame 64 via the base 67. Accordingly, the opener-side door drive mechanism 66 is provided for opening and closing the FOUP 25.

In this embodiment, the robot 27 is achieved by using a horizontal articulated robot. The robot 27 is disposed in the interface space 29, and is configured to include a robot hand 40 which can hold each wafer 24, a robot arm 41 adapted to displace and drive the robot hand 40, a vertical drive member 42 adapted to displace and drive the robot arm 41 in the upward and downward directions Z, and a base 43 adapted to fix the vertical drive member 42 to the frame 64. With control of the robot arm 41 and the vertical drive member 42 due to a controller 44 adapted to control the robot arm 41 and the like members, each wafer 24 can be transferred while being held by the robot hand 40.

The robot hand 40 is advanced into the FOUP internal space 34 of the FOUP 25 while the FOUP 25 is opened by the opener 26, and holds each wafer 24 contained in the FOUP 25. Subsequently, the robot hand 40 passes through the interface space 29, and is then advanced into the processing space 30 of the semiconductor processing apparatus 22, so as to transfer the held wafer 24 in a predetermined wafer locating position. Alternatively, the robot hand 40 enters the processing space 30, and holds each wafer 24 which is held in the wafer locating position. Thereafter, the robot hand 40 passes through the interface space 29, and is then advanced into the FOUP internal space 34, so as to transfer the held wafer 24 to a containing position of the FOUP 25. In this embodiment, since the openers 26 are provided at three points, each FOUP 25 supported on each FOUP supporting portion 31 of the openers provided at three points is set to enable carrying in and carrying out processes of each wafer 24.

Figure 5:
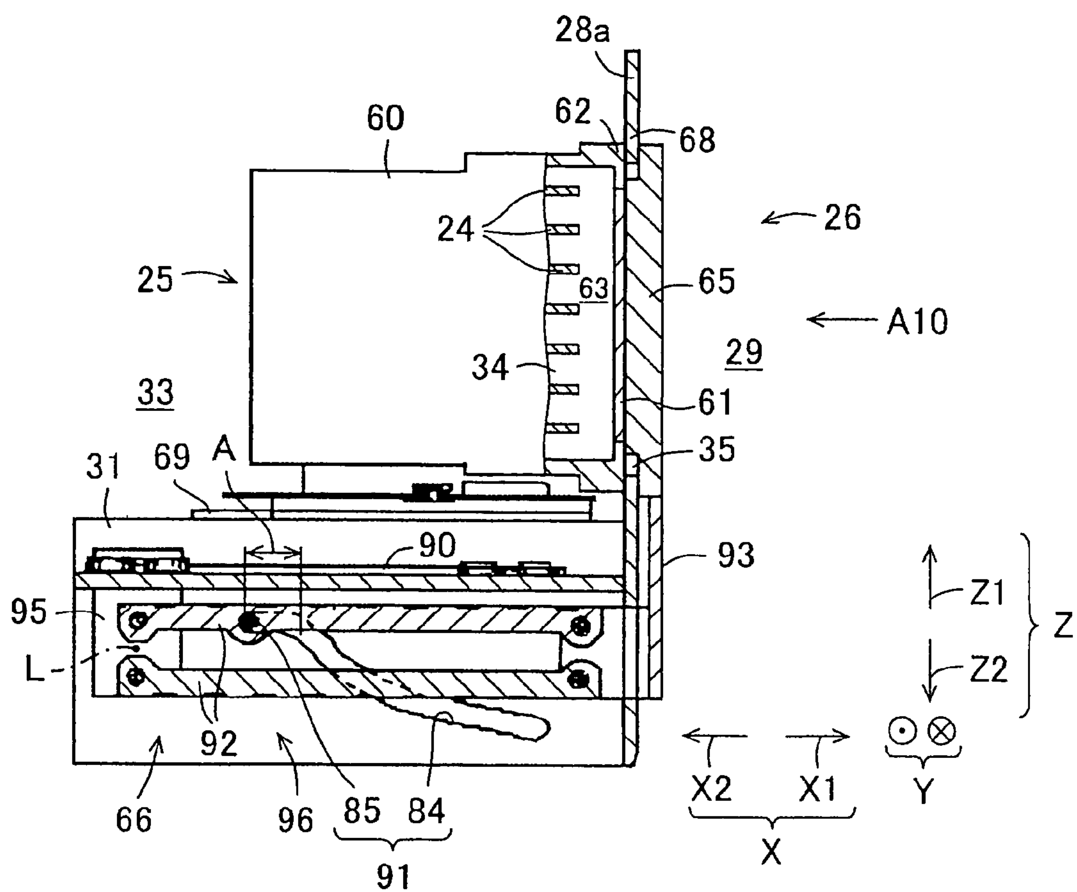
FIG. 5 is a side view showing an opener 26, which is partly cut away.
Figure 6:
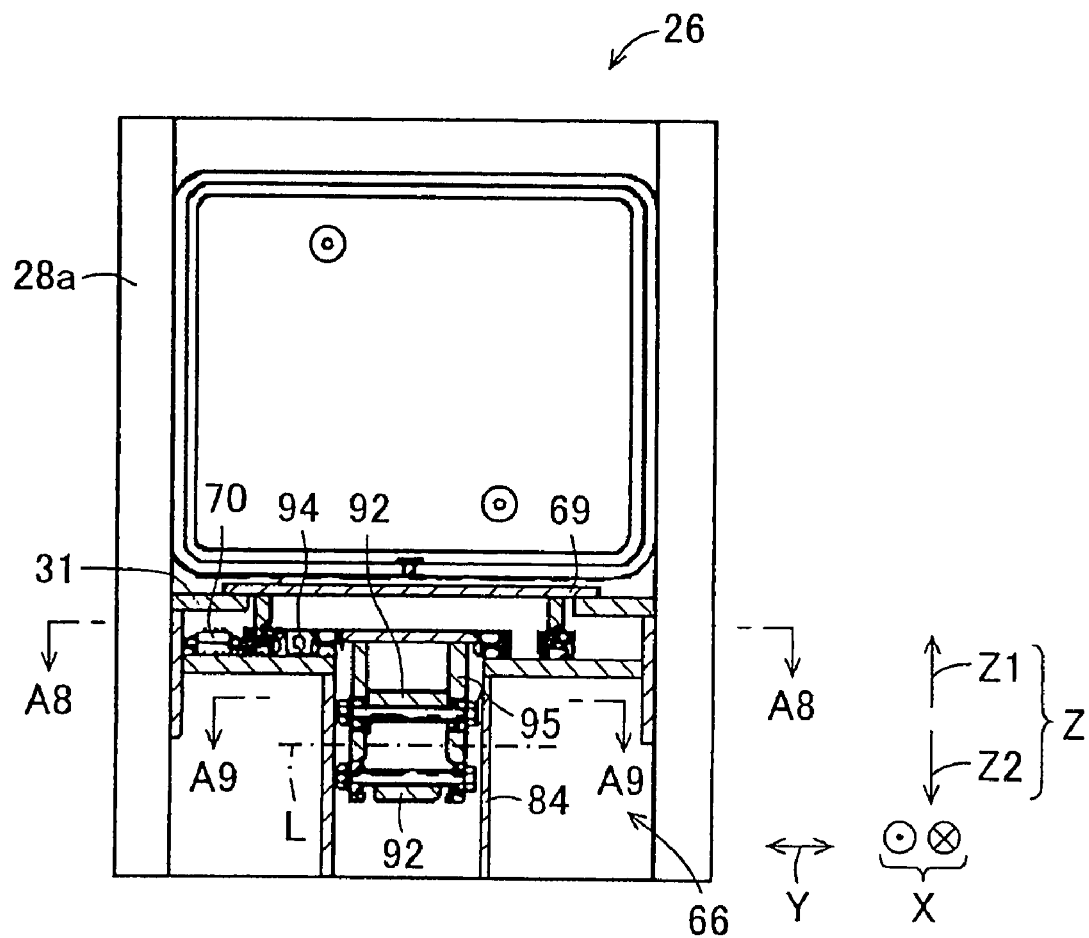
FIG. 6 is a front view showing the opener 26.

Next, FIGS. 5 to 10 will be referred. As shown in FIG. 5, the front face wall 28*a* is formed into a plate-like shape, in which opener-side apertures 35 are formed such that each wafer 24 can pass therethrough in the forward and backward directions X. Across the front face wall 28*a*, the space defined on one side along the thickness direction corresponds to the interface space 29, while the space defined on the other side along the thickness direction corresponds to the external space 33. The opener-side door 65 is configured to open and close the opener-side opening 68 formed in the front face wall 28*a*.

Each opener 26 further includes a table portion 69 on which the opener-side opening 68 places and locates each FOUP 25, and a FOUP drive means 70 adapted to move the table portion 69 in the forward and backward directions X so as to move and locate the FOUP 25 placed on the table portion 69 into the wafer transferring position. The FOUP drive means 70 serves as a substrate container drive means adapted to drive and displace each FOUP 25 in the forward and backward directions X. With transfer of the table portion 69, on which the FOUP 25 is placed, due to the FOUP drive means 70, a state wherein the FOUP 25 is located in the wafer transfer position where it is closely contacted with the front face wall 28*a* and a state wherein the FOUP 25 is located in a FOUP detaching position where it is spaced away form the front face wall 28*a* can be switched.

The opener-side door 65 includes an attachment and detachment mechanism adapted to activate and deactivate a latch mechanism for attaching and detaching the FOUP-side door 61 relative to the FOUP main body 60. The attachment and detachment mechanism can be achieved, for example, by employing an attaching and detaching latch key. The opener-side door 65 also includes a holding mechanism adapted to hold the FOUP-side door 61 which has been removed from the FOUP main body 60. The holding mechanism can be achieved, for example, by employing a suction pad and/or providing a fitting portion adapted to be fit in the FOUP-side door 61.

The FOUP supporting portion 31 is located on the side of the external space 33 relative to the front face wall 28*a* and is provided adjacent the front face wall 28*a*. The FOUP supporting portion 31 includes the horizontally extending table portion 69 so that it can support the FOUP 25 by placing the FOUP 25 on the table portion 69. The FOUP supporting portion 31 has an internal space defined therein, in which the FOUP drive means 70 for displacing and driving the table portion 69 is located. The FOUP supporting portion 31 can align the FOUP 25 placed on the table portion 69 with the wafer transferring position and the FOUP detaching position, by employing the FOUP drive means 70 for driving the table portion 69 to be moved in the forward and backward directions X. As used herein, the forward and backward directions X mean the thickness direction of the front face wall 28*a* as well as the carrying in and carrying out directions of the wafer 24, being horizontal or substantially horizontal directions.

The FOUP 25 to be aligned with the wafer transferring position is located in a position so as to face the opener-side opening 68 formed in the front face wall 28*a*, with the FOUP-side opening 62 formed in the FOUP 25 being closely contacted with the front face wall 28*a*. The FOUP 25 to be aligned with the FOUP detaching position is moved away from the front face wall 28*a* in the backward direction X2, as such it can be detached from the wafer transfer apparatus 23.

In the case of opening the opener-side opening 68, the opener-side door drive mechanism 66 drives the opener-side door 65, now closing the opener-side opening 68, to be moved to an opening position spaced away from the opener-side apertures 35, both in the forward and backward directions X and in the upward and downward directions Z. With this movement of the opener-side door 65 holding the FOUP-side door 61 to the opening position while the FOUP 25 is located in the wafer transferring position of the front face wall 28*a*, the FOUP internal space 34 and the interface space 29 can be communicated with each other while airtightly closing them against the external space 33.

In the case of closing the opener-side opening 68, the opener-side door drive mechanism 66 drives the opener-side door 65, now located at the opening position, to be moved closed to the opener-side opening 68, both in the forward and backward directions and in the upward and downward directions Z, as such moving it to a closing position for closing the opener-side opening 68. With this movement of the opener-side door 65 holding the FOUP-side door 61 to the closing position while the FOUP 25 is located in the wafer transferring position of the front face wall 28*a*, the communication between the FOUP internal space 34 and the interface space 29 can be blocked while airtightly closing them against the external space 33.

Once blocking the communication between the FOUP internal space 34 and the interface space 29, the FOUP 25 can be separated from the FOUP supporting portion 31. In this way, contact of each wafer 24 with the outside air can be prevented both when the wafer 24 is carried into the semiconductor processing equipment 20 and when the wafer 24 is carried out from the semiconductor processing equipment 20. Accordingly, for each wafer 24 to be processed, contact with dust particles present in the outside air can be prevented.

The opener drive mechanism 66 is configured to include a movable body 95, a movable body drive means 94, a connector 93, a link member 92 and a link member angular displacement means 91. The movable body 95 is configured such that it can pass through a space in the vicinity of the FOUP 25 which is supported by the FOUP supporting portion 31, and move in the forward and backward directions X. In this embodiment, the movable body 95 is configured to move in the forward and backward directions X through a space provided below the table portion 69 of the FOUP supporting portion 31. In the state wherein the opener-side door 65 closes the opener-side opening 68, the movable body 95, movable body drive means 94, link member 92 and link member angular displacement means 91 are located in the internal space defining the space below the table portion 69 of the FOUP supporting portion 31.

Figure 7:
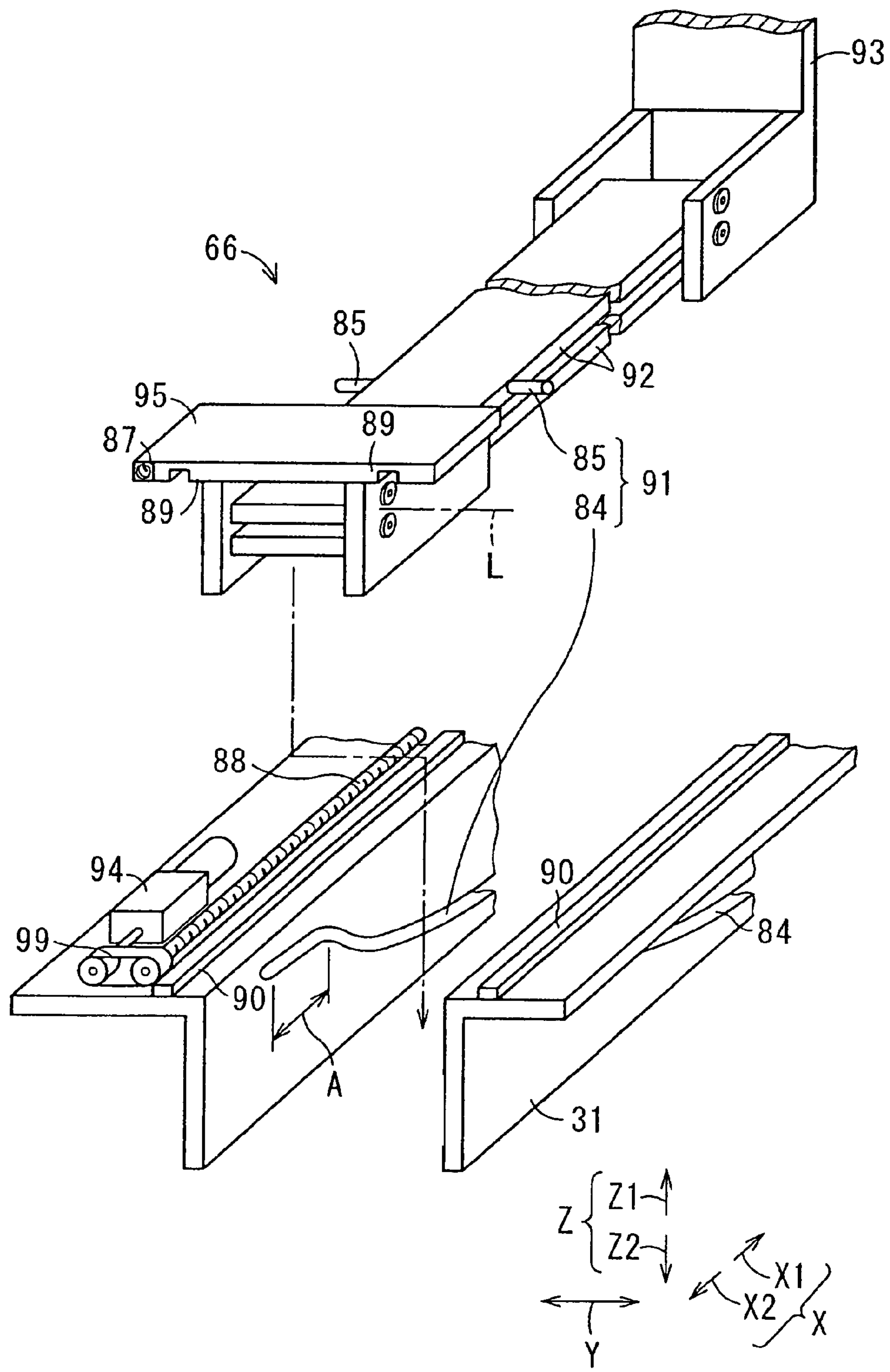
FIG. 7 is a perspective view schematically showing an opener-side door drive mechanism 66.
Figure 8:
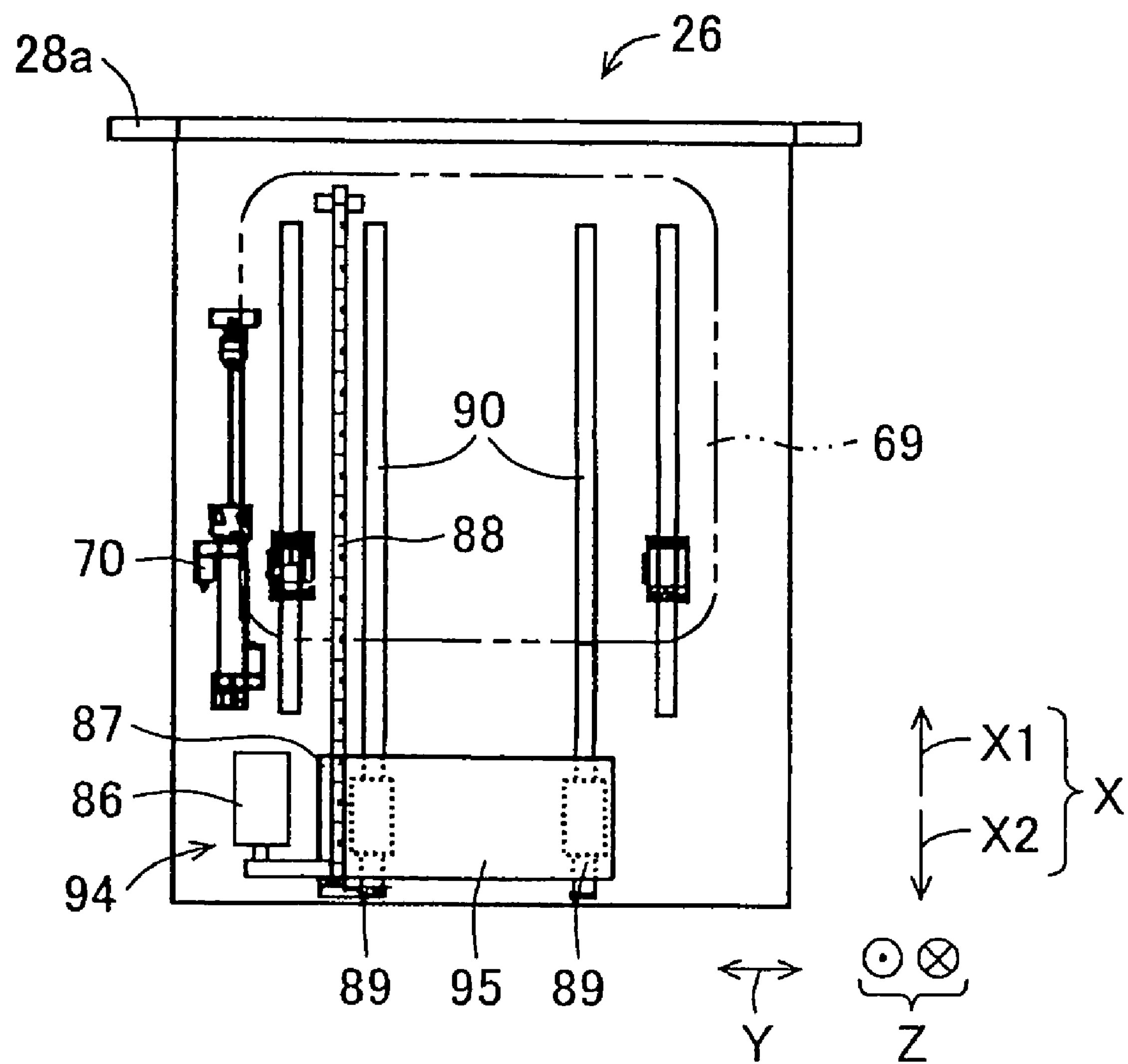
FIG. 8 is a diagram of the opener 26 when viewed along the direction denoted by arrows A8-A8 in FIG. 6.

As shown in FIGS. 7 and 8, in the FOUP supporting portion 31, two rail-like guide members 90 extending in the forward and backward directions X are arranged with a space therebetween. In the movable body 95, fitting portions 89 are formed, each of which is adapted to be fitted in each guide member 90. The fitting of the fitting portions 89 of movable body 95 into each guide member 90 prevents displacement of the movable body 95 in directions other than the forward and backward directions X but enables the movable body 95 to be guided in the forward and backward directions X. In such a manner, the movable body 95 is supported by the FOUP supporting portion 31.

The movable body drive means 94 is supported by the FOUP supporting portion 31 and displaces and drives the movable body 95 in the forward and backward directions X for reciprocating operation. In this embodiment, the movable body drive means 94 is configured to include a screw shaft 88 which extends in the forward and backward directions X and is supported rotatably by the FOUP supporting portion 31, a thread engaging portion 87 which is engaged via threads with the screw shaft 88 and secured to the movable body 95, a motor 86 adapted to rotate the screw shaft 88, and a power transmission element 99 which is adapted to transmit the power of the motor 86 to the screw shaft 88 so as to rotate the screw shaft. In this embodiment, a ball screw mechanism is composed of the thread engaging portion 87 and the screw shaft. The power transmission mechanism 99 is achieved by employing a belt power transmission mechanism, which includes a first pulley fixed to the output shaft of the motor, a second pulley fixed to the screw shaft 88, and a belt wound around and across the first pulley and the second pulley. In such a configuration, by rotating the screw shaft 88 due to the motor 86, the thread engaging portion 87 engaged via threads with the screw shaft 88 is moved in the forward and backward directions X, as such the movable portion 95 is moved in the forward and backward directions X together with the thread engaging portion 87.

In this embodiment, while the movable body 95 is moved by using the screw shaft 88, other designs may be employed for displacing the movable body 95 in the forward and backward directions X. For instance, the movable body 95 may be moved in the forward and backward directions X by using an air cylinder mechanism, a rack and pinion mechanism or the like.

Figure 9:
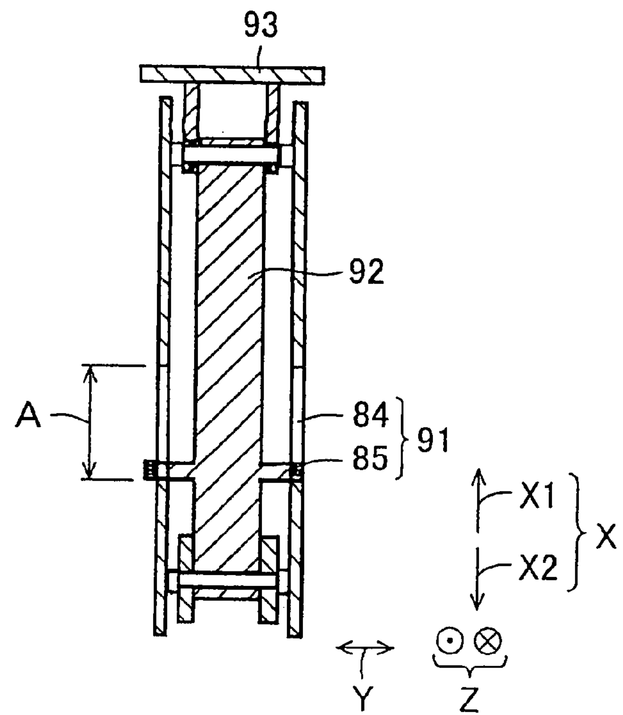
FIG. 9 is a diagram of the opener 26 when viewed along the direction denoted by arrows A9-A9 in FIG. 6.
Figure 10:
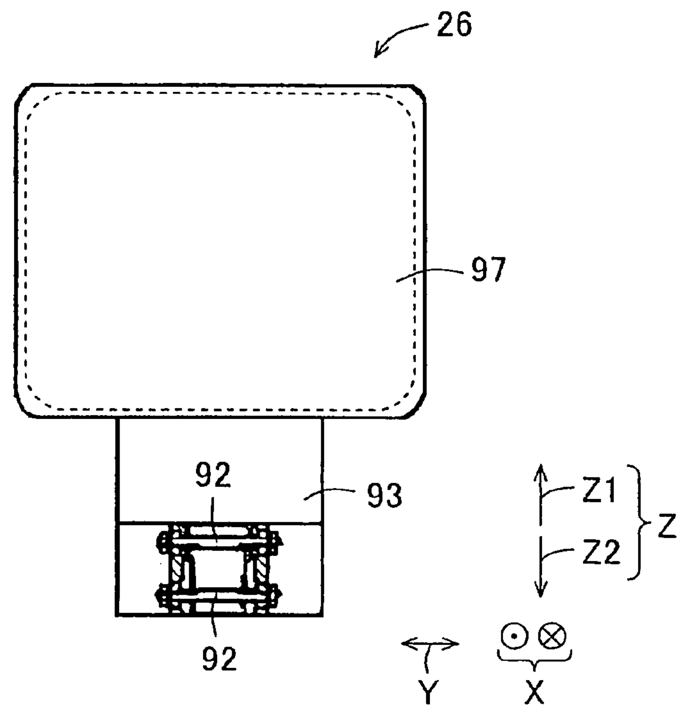
FIG. 10 is a diagram of the opener 26 when viewed along the direction denoted by an arrow A10 in FIG. 6.

As shown in FIGS. 5, 9 and 10, the connector 93 is fixed to the opener-side door 65. The connector 93 extends from the opener-side door 65 in the downward direction Z2 which is vertical to the forward and backward directions X. Specifically, the top end of the connector 93 is connected with the opener-side door 65, and the bottom end of the connector 93 is located below the top face of the FOUP supporting portion 31.

As shown in FIGS. 5 and 7, the link member 92 is provided in plural numbers, and each link member 92 links the movable body 95 with the connector 93 so as to constitute a parallel link mechanism. In this way, since the parallel link mechanism is provided by using each link member 92, movable body 95 and connector 93, the connector 93 linked to the movable body 95 can be rotated about the angular displacement axis L1 of the movable body 95 while maintaining its attitude.

In this embodiment, the angular displacement axis L extends in the horizontal left and right directions Y which are vertical to the forward and backward directions X. In this case, two link members 92 are provided. The two link members 92 extend in parallel to each other, with one ends being connected rotatably with the movable body 95 and with the other ends being connected rotatably with the connector 93. Each link member 92 is formed to have an equal length. In this embodiment, each link member 92 extends horizontally while the opener-side door 65 closes the opener-side opening 68. In this case, each link member 92 is formed into a plate-like shape, defining a longitudinal direction corresponding to the forward and backward directions X and defining a width direction corresponding to the left and right directions Y.

The link member angular displacement means 91 controls the angular displacement of each link member 92, relative to the movable body 95, into a predetermined angular position, corresponding to the position in the forward and backward directions of the movable body 95. As shown in FIGS. 7 and 9, the link member angular displacement means 91 is configured to include engaging portions 85 and controlling portions 84. The engaging portions 85 are provided to either one of the link members 92. Each controlling portion 84 is adapted to be engaged with each engaging portion 85 so as to control the angular position of the engaging portion 85 corresponding to the position in the forward and backward directions of the movable body 95.

The engaging portions 85 can be achieved by using pin members projecting from the middle portion along the longitudinal direction of the link member 92 and in parallel to the angular displacement axis L1. The controlling portions 84 can be realized by providing slit grooves or recesses formed in the FOUP supporting portion 31 such that each engaging portion 85 can be fitted therein. The recesses of the controlling portions 84 are each formed into a long hole whose position varies in the upward and downward directions as it moves in the forward and backward directions X. The recesses of the controlling portions 84 are sized to be slightly larger than the fitting portions of the engaging portions 85 to be fitted in the controlling portions 84. The engaging portions 85 extend in parallel to the angular displacement axis L. The engaging portions 85 to be fitted in the recesses of the controlling portions 84 are formed such that they can be moved in the direction along which the recesses of the controlling portion 84 extend, respectively. Thus, in the state wherein the transfer of the movable body 95 is stopped, angular displacement of the engaging portions 85 about the angular displacement axis L1 can be prevented due to the fitting of each engaging portion 85 in the controlling portions 84, thereby maintaining the amount of angular displacement of the link members 92 at a predetermined value.

The recesses of the controlling portions 84 extend toward the front face wall 28*a*, from the farthest position relative to the front face wall 28*a*, in parallel to the forward and backward directions X, until they advance a preset distance A. After advancing the preset distance A, the controlling portions 84 extend in the downward direction Z2 as they further advance in the forward direction X1. In this embodiment, the distance A is preset at 25 mm, for example. In this embodiment, the engaging portions 85 project on both sides of the link members 92, respectively. The recesses of the controlling portions 84 are provided on both sides of the link members 92, such that the two engaging portions 85 can be fitted therein, respectively.

Figure 11:
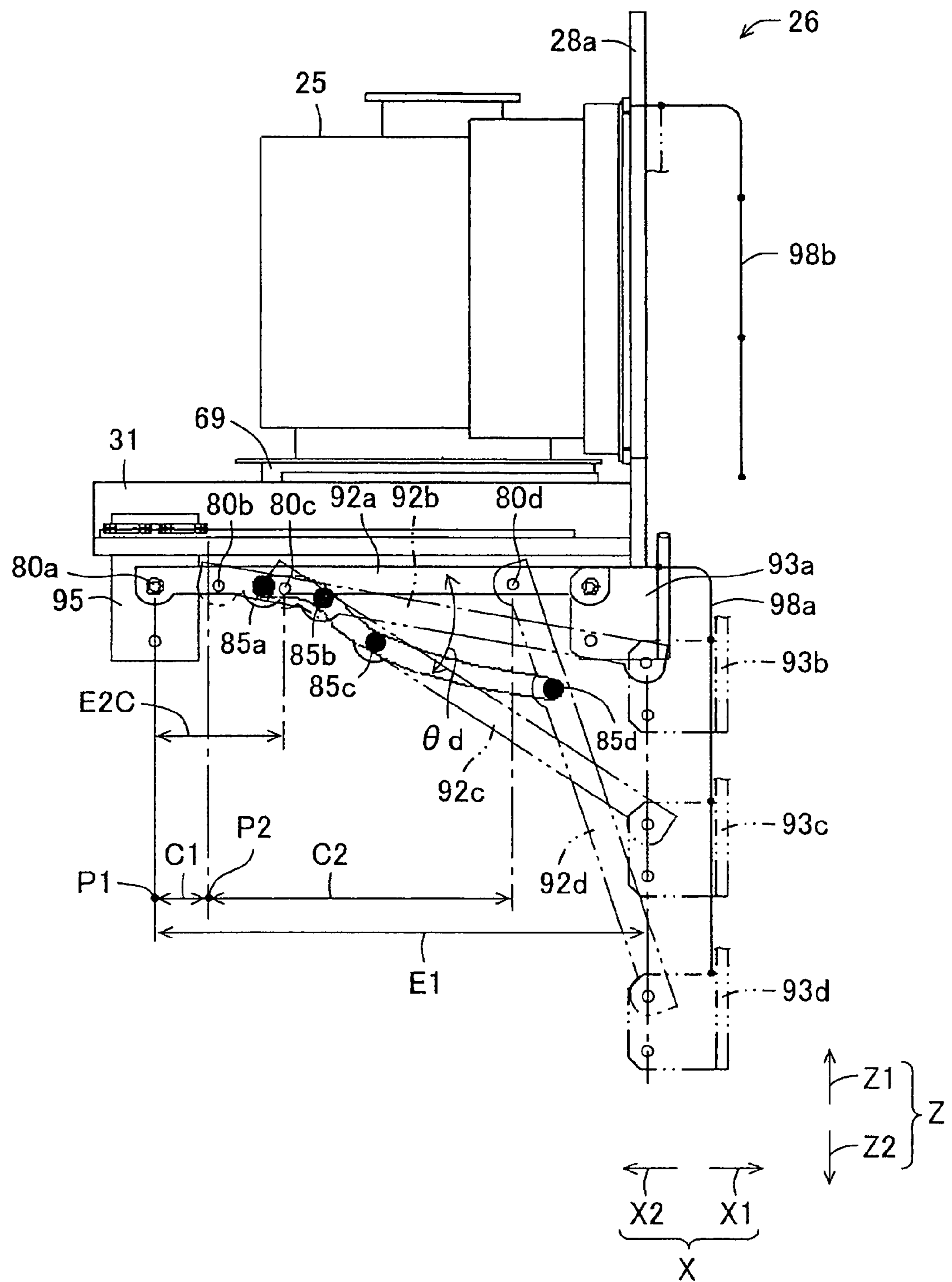
FIG. 11 is a diagram illustrating a manner of an angular displacement of a link member 92 which is driven along with movement in forward and backward directions of a movable body 95.

FIG. 11 is a diagram showing angular displacement of one link member 92 adapted to move forward and backward together with the movable body 95. In FIG. 11, to facilitate understanding, the opener 26 is shown to be partly omitted. In FIG. 11, each element is depicted with subscripts "a" to "d" added to the reference numeral thereof, corresponding to respective shifted positions 80*a* to 80*d* of the connecting point 80 between the movable body 95 and each link member 92. As shown in the drawing, the movable body 95 is advanced in the forward direction X1, as the subscript is changed from "a" to "d". As described above, the connector 93 is connected with the movable body 95 which is movable in the forward and backward directions X, and is configured such that it can be angularly displaced about the angular displacement-axis L1 relative to the movable body 95. Accordingly, the connector 93 can be located in any given position in the forward and backward directions X as well as in the upward and downward directions Z, by respectively determining the position in the forward and backward directions of the movable body 95 and the angle about the angular displacement axis L1 of the link members 92 relative to the movable body 95. In this embodiment, the angular position of the link members 92 relative to the movable body 95 can be determined, with operation along with the transfer in the forward and backward directions of the movable body 95, by using the link member angular displacement means 91, such that the connector 93 can be moved along a predetermined track, corresponding to the transfer in the forward and backward directions of the movable body 95.

Assume that the connecting point 80 at which the movable body 95 and each link member 92 are connected together is a reference position of the movable body 95. While the movable body 95 is moved in the forward and backward directions X over a distance C1 between a closing position P1 in which the movable body 95 is located, in the closed state wherein the FOUP-side door 61 holding the opener-side door 65 closes the FOUP main body 60, and a detaching position P2 in which the movable body 95 is moved the preset distance A from the closing position P1 in the forward direction X1, the angular displacement of the link members 92 relative to the movable body 95 is controlled such that the connector 93 is moved in the forward and backward directions X. Furthermore, while the movable body 95 is moved in the forward and backward directions X over an evacuating region C2 located in the forward direction X1 relative to the detaching position P2, the angular displacement of the link members 92 relative to the movable body 95 is determined such that the connector 93 is moved in the upward and downward directions Z.

In this embodiment, during the transfer over the distance C1 between the closing position P1 in which the movable body 95 is initially located and the detaching position P2 in which the movable body 95 is moved the preset distance A from the closing position P1 in the forward direction X1, the link member angular displacement means 91 keeps the angle θ of each link member 92 relative to the movable body 95 at a constant or substantially constant value. Thus, the connector 93 can be moved in the forward and backward directions X. In the evacuating region C2, the link member angular displacement means 91 increases the angle of each link member 92 relative to the movable body 95, in response to the shift of the movable body 95 in the forward direction X1, while decreasing the angle of the link member 92 relative to the movable body 95, in response to the shift of the movable body 95 in the backward direction X2.

Assume that the distance in the forward and backward directions from the closing point P1 to the position of the connector 93, in which the transfer along the forward and backward directions should be stopped, is distance E1. Further, assume that the distance in the forward and backward directions from the closing point P1 to the position of the movable body 95 is distance E2, and that the length of each link member 92 is F. In this case, the angular position of each link member 92 is determined such that the angle θ of the link member 92 relative to the movable body 95 is $\cos^{-1}((E1-E2)/F)$. With such configuration, when the movable body 95 is moved in the forward and backward directions X, the connector 93 can be moved in the upward and downward directions Z while the connector 93 is maintained in the position E2 in the forward and backward directions. The term "$\cos^{-1}$" means "arc cosine", i.e., the inverse cosine trigonometric function. In this case, assume that the angle is positive when the link member 92 is angularly displaced in the downward direction Z2 from the horizontal plane. For example, in FIG. 11, the angular position of the link member 92 is determined such that the angle θc of the link member 92 relative to the movable body 95, in the case where the connecting point 80 of the movable body 95 is located in a point E2*c*, is defined as $\cos^{-1}((E1-E2c)/F)$.

Initially, as the movable body 95 is moved in the forward direction X1 from the closing point P1, the connector 93 is moved in the forward direction X1. When the movable body 95 reaches the detaching position P2, after moved the preset distance A from the closing position P1, and is further moved in the forward direction X1, the connector 93 is moved horizontally while moved gradually in the vertically downward direction, and is then moved along a completely vertical or substantially vertical track, and finally moved in the downward direction Z2. Contrary, when the movable body 95 is moved in the backward direction X2 from the evacuating region C2, the connector 93 is moved in the upward direction Z1, and is further moved vertically upward while moved gradually in the horizontal direction. Thereafter, it is moved along a completely horizontal or substantially horizontal track. Furthermore, when the movable body 95 reaches the detaching position P2, and is further moved in the backward direction X2, the connector 93 is also moved in the backward direction X2. The opener-side door 65, which is integrally fixed to the connector 93, is also moved along a track of a similar shape to the connector 93. In FIG. 11, the transfer track of the connector 93 is expressed by 98*a*, while the transfer track of the opener-side door 65 is expressed by 98*b*.

Figure 12:
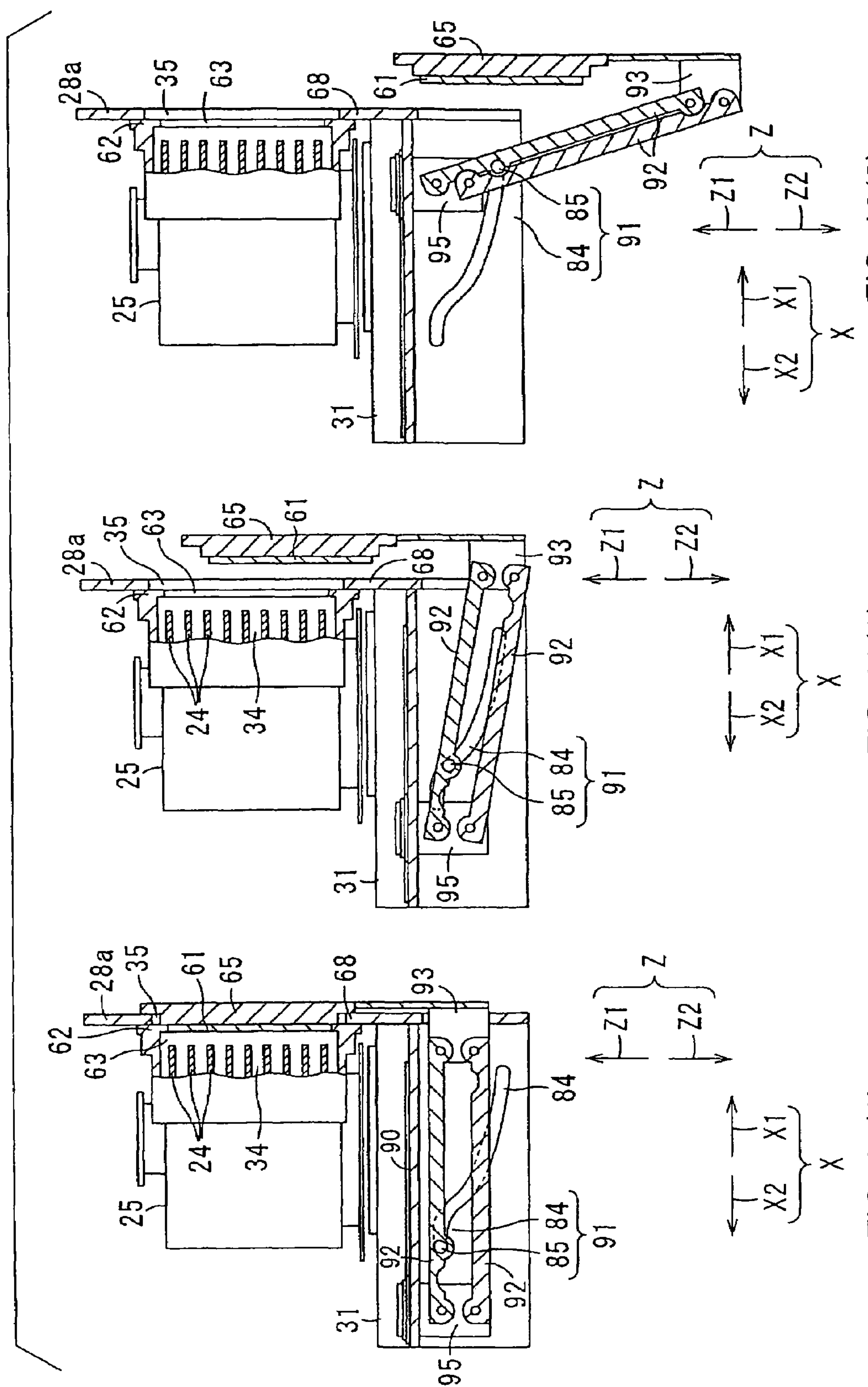
FIGS. 12(1) to 12(3) are diagrams illustrating opening and closing operations of an opener-side door 65.

FIGS. 12(1) to 12(3) are diagrams illustrating opening and closing operations of the opener-side door 65, wherein FIG. 12(1) illustrates a state in which the opener-side door 65 closes the opener-side opening 68, FIG. 12(2) shows a state in which the opener-side door 65 is moved away from the opener-side opening 68, and FIG. 12(3) illustrates a state in which the opener-side door 65 completely opens the opener-side opening 68.

As shown in FIG. 12(1), until the movable body 95 is moved the preset distance A in the forward and backward directions X from the state in which the opener-side door 65 closes the opener-side opening 68, the angular displacement of each link member 92 relative to the movable body 95 is prevented due to the link member angular displacement means 91. With prevention of the angular displacement of each link member 92, the connector 93 is moved in the forward and backward directions X together with the movable body 95. Thus, the opener-side door 65 is also moved in the forward and backward directions X together with the connector 93. Consequently, the opener-side door 65 is moved in parallel to the forward direction X1 from the front face wall 28*a* so as to be detached from the front face wall 28*a*.

As shown in FIG. 12(2), when the movable body 95 is further moved in the forward direction X1, from the detaching position in which the movable body 95 has reached after moving the preset distance A in the forward direction X1 toward the front face wall 28*a*, the angle of each link member 92 relative to the movable body 95 is gradually increased, due to the link member angular displacement means 91, along with the movement of the movable body 95. With such increase of the angular displacement of each link member 92, the connector 93 is angularly displaced about the angular displacement axis L relative to the movable body 95, along with the movement of the movable body 95. In this embodiment, with adjustment of the angle due to the link member angular displacement means 91, the connector 93 is moved in the downward direction Z2 relative to the FOUP supporting portion 31. Thus, the opener-side door 65 is also moved in the downward direction Z2 along with the connector 93. Accordingly, as shown in FIG. 12(3), the opener-side door 65 is moved away from the front face wall 28*a* in the downward direction Z2 from the state wherein the opener-side door 65 is spaced away from the front face wall 28*a* in the forward direction X1. With such an opening operation while the opener-side door 65 holds the FOUP-side door 61, the FOUP-side door 61, which has been removed from the FOUP main body 60, is withdrawn into the interface space 29. Thereafter, the FOUP-side door 61 is moved in the downward direction Z2, bringing the FOUP internal space 43 and the interface space into a communicated state, thereby opening the FOUP main body 60.

Similarly, in the case where the movable body 95 is moved in the backward direction X2 from a position where it is closest to the front face wall 28*a*, the opener-side door 65 is advanced together with the connector 93 in the upward direction Z1 so as to approach the front face wall 28*a*. When the movable body 95 is further moved away from the front face wall 28*a* in the backward direction X2, the opener-side door 65 is moved in the backward direction X2 so as to close the opener-side opening 68 of the front face wall 28*a*. With such a closing operation while the opener-side door 65 holds the FOUP-side door 61, the FOUP-side door 61, which has been removed from the FOUP main body 60, is in contact again with the FOUP main body 60, thereby closing the FOUP main body 60.

Due to the connection of the movable body 95 and the connector 93 via a plurality of link members 92 so as to constitute a parallel link mechanism, the connector 93 can be advanced while keeping its attitude the same. Accordingly, with such and opener-side door drive mechanism 66 of this embodiment, the opener-side door 65 can also be moved in the forward and backward directions X as well as in the upward and downward directions Z while maintaining its attitude the same.

As described above, the link member angular displacement means 91 keeps the angle of each link member 92 relative to the movable body 95, during the positional change, from the closing state in which the opener-side door 65 closes the opener-side opening 68 to the state in which the movable body 95 is moved over the preset distance A in the forward direction X1. The link member angular displacement means 91 increases the angle of each link member 92 relative to the movable body 95 as the movable body 95 is further moved in the forward direction X1 from the detaching position after it has been moved over the preset distance A. With such configuration, by moving the movable body 95 in the forward and backward directions X, the opener-side door 65 can be moved in the horizontal direction as well as in the vertical direction, as such the FOUP main body 60 can be opened and closed by the FOUP-side door 61 which is held by the opener-side door 65. The preset distance A is set as a distance that can prevent interference of the FOUP-side door 61 or the like part with the front face wall 28*a* or the like element, in the case where the opener-side door 65 holding the FOUP-side door 61 is moved in the downward direction Z2 from the front face wall 28*a*. For example, the preset distance A is set to be larger than a value obtained by adding the dimension measured in the thickness direction of the front face wall 28*a* to the dimension measured in the thickness direction of the FOUP-side door 61.

According to this embodiment, due to the connection between the movable body 95 and the connector 93 via a plurality of link members 92 for constituting a parallel link mechanism, the opener-side door 65 fixed to the connector 93 and the FOUP-side door 61 held by the opener-side door 65 can be moved while keeping their attitudes the same. In this embodiment, the FOUP-side door 61 held by the opener-side door 65 can be displaced in the forward and backward directions X as well as angularly displaced about the angular displacement axis L of the movable body 95, thus it can be moved in two directions in the plane vertical to the angular displacement axis L in order to open and close the container body.

Due to the movable body drive means 94 for driving the movable body 95 in the forward and backward directions X, the FOUP-side door 61 held by the opener-side door 65 can be moved in the forward and backward directions X as well as in the upward and downward directions Z, so that the FOUP-side door 61 can be moved toward or away from the FOUP main body 60 in order to close and open the FOUP main body 60. The movable body 95 can be moved in the vicinity of the FOUP 25 supported by the FOUP supporting portion 31 even in the case of being moved in the forward and backward directions, thus there is no need for providing a mechanism for driving the movable body 95 in a position away from the FOUP supporting portion 31. Accordingly, in this embodiment, the opener-side door drive mechanism 66 can be located in the vicinity of the FOUP supporting portion 31, thereby downsizing the openers 26. Additionally, a space provided away from the FOUP supporting portion 31 can be utilized effectively.

While the movable body 95 is moved over the region C1 between the closing position P1 and the detaching position P2, the FOUP-side door 61 is moved in the direction consisting of or essentially consisting of directional components of the forward and backward directions X. Thus, when the FOUP-side door 61 is moved close to or away from the FOUP main body 60 in the forward and backward directions X, interference of the opening 62 of the FOUP main body 60 and the front face wall 28*a* with the FOUP-side door 61 can be prevented. Namely, the FOUP-side door 61 can be smoothly moved close to and away from the FOUP main body 60.

While the movable body 95 is moved over the evacuating region C2 in the forward and backward directions X, the FOUP-side door 61 is moved close to and away from the FOUP main body 60 in the upward and downward directions Z. Thus, the transfer in the forward and backward directions X of the FOUP-side door 61 can be controlled while it is spaced away from the FOUP main body 60, as such reducing the movable range of the FOUP-side door 61 in the forward and backward directions X, thereby to reduce the dimension in the forward and backward directions of the movable space required for opening and closing the FOUP main body 60. With such configuration, interference of the FOUP-side door 61 and the opener-side door 65 with other elements arranged in the substrate transfer apparatus 23, for example, robots for transferring substrates, can be prevented.

In the case of opening the FOUP main body 60, the FOUP-side door 61 is moved away from the FOUP main body 60, while drawing a horizontal or substantially horizontal track, and after the horizontal movement, it is further moved away from the FOUP main body 60, while drawing a vertical or substantially vertical track. In the case of closing the FOUP main body 60, the FOUP-side door 61 approaches the FOUP main body 60, while being spaced away from the FOUP main body 60 and drawing a vertical or substantially vertical track, and after the approach, it is in contract with the FOUP main body 60, while drawing a horizontal or substantially horizontal track. In this way, with the opening operation of the FOUP main body 60 by moving the FOUP-side door 61 below the FOUP main body 60, air stream flowing from above to below can be created, thus reducing the possibility that dust particles are attached to the FOUP internal space 34 and interface space 29, thereby preventing contamination of substrates upon carrying in and carrying out them.

According to this embodiment, since the FOUP supporting portion 31 supports the movable body drive means 94, link member angular displacement means 91 and movable body 95, there is no need for separately providing portions adapted to support the movable drive means 94 and movable body 95, thus reducing the number of components constituting the openers 26. Consequently, simplification and weight reduction of the openers 26 can be achieved, and their structure can be simplified, thereby reducing the production cost of the openers 26. For instance, by using the FOUP supporting portion 31 to support each element for constituting the opener-side door drive mechanism 66, the need for having the front face wall 28*a* formed in the openers 26 fix and support each constitutional element of the opener-side door drive mechanism 66 can be eliminated, as such downsizing the front face wall 28*a*, and hence lowering the rigidity of the front face wall 28*a*, thereby to reduce the production cost of the openers 26.

According to this embodiment, with the link member angular displacement means 91 including the engaging portions 85 and controlling portions 84, adjustment of the angular displacement of each link member 92 relative to the movable body 95 can be achieved without providing any separate driving force. Thus, only by moving the movable body 95 in the forward and backward directions X due to the movable body drive means 94, each link member 92 can be angularly displaced along with the transfer of the movable body 95. Therefore, the configuration of the openers 26 can be further simplified, thereby reducing the number of components.

In this embodiment, due to the arrangement of the movable body drive means 94, link member angular displacement means 91 and movable body 95 in the internal space formed in the FOUP supporting portion 31, there is no need for separately providing a cover for covering the movable body drive means 94, link member angular displacement means 91 and movable body 95, thus reducing the number of parts. Accordingly, the openers 26 can be further downsized, and the entire structure can be further simplified.

Figure 13:
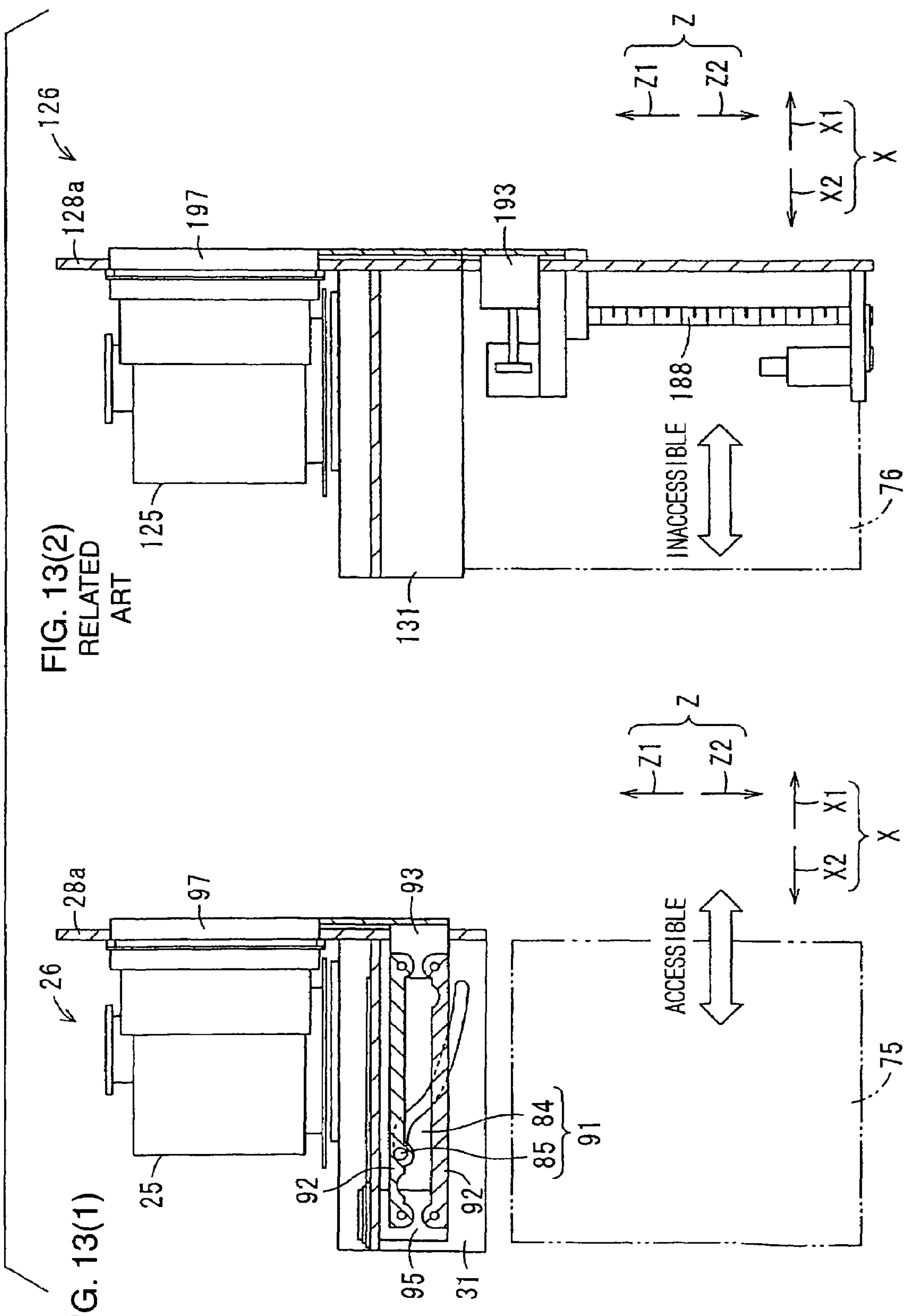
FIGS. 13(1) and 13(2) are diagrams showing a comparison between the opener 26 according to the embodiment of the present invention, FIG. 13(1), and an opener 126 as a comparative example, FIG. 13(2)

FIGS. 13(1) and 13(2) are diagrams provided for comparison between the opener 26 of this embodiment and an opener 126 of a comparative example. FIG. 13(1) shows the opener 26 of this embodiment, and FIG. 13(2) shows the opener 126 of one comparative example. The opener 126 of the comparative example includes a screw shaft 188 which extends in the upward and downward directions Z and is adapted to move a connector 193 connected with an opener-side door 165. It is noted that like parts employed in the opener 126 of the comparative example, which are also included in this embodiment, are designated by reference numerals shown by adding 100 to the corresponding reference numerals shown in this embodiment, and the description of their details are omitted.

In the case of the opener 26 of this embodiment, the movable body 95 is housed in the internal space of the HOUP supporting portion 31. Thus, the dimension in the horizontal direction can be reduced as compared with the opener 126 of the comparative example shown in FIG. 13(2). In this embodiment, unlike the opener 126 of the comparative example, there is no need for supporting a guide means for guiding the screw shaft 188 and connector 193, by using a front face wall 128*a*. Therefore, the front face wall 28*a* can be downsized, thereby providing it at a significantly low production cost. In this embodiment, a door can be provided, with which a worker can enter the space below the FOUP supporting portion 31, thus the provision of such a door can facilitate the maintenance. In addition, since the link members 92 can extend horizontally while the movable body 93 is moved to the closing position P1, the opener 26 in the closed state can be further downsized.

Figure 14:
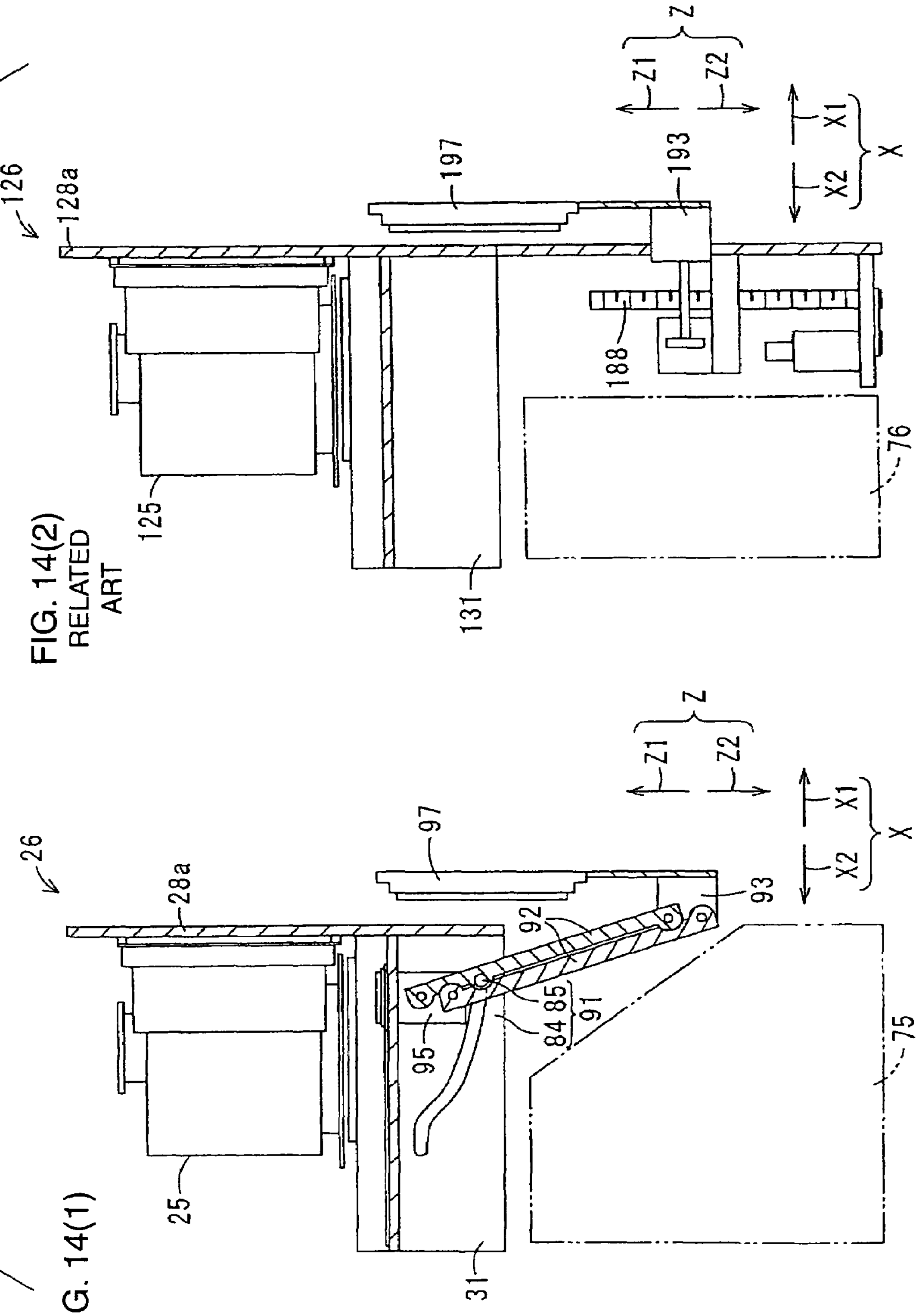
FIGS. 14(1) and 14(2) are diagrams showing a comparison between the opener 26 according to the embodiment of the present invention, FIG. 14(1) and the opener 126 as the comparative example, FIG. 14(2)

FIGS. 14(1) and 14(2) are diagrams provided for comparison between the opener 26 of this embodiment and another opener 126 of an alternative comparative example. FIG. 14(1) shows the opener 26 of this embodiment, and FIG. 14(2) shows the opener 126 of the comparative example. In the opener 26 of this embodiment, the opener-side door drive mechanism 66 can be located in a position adjacent, in the upward and downward directions, to the FOUP supporting portion 31. Thus, the space 75 provided away from the FOUP supporting portion 31 can be utilized effectively. On the other hand, in the opener 126 of the comparative example, a drive means for driving a movable body 193 and a guide means for guiding the movable body 193 should be arranged in positions spaced away from a FOUP supporting section 131. Therefore, the space 76, which is defined away from the FOUP supporting portion 131, can not be utilized effectively. Accordingly, this embodiment enables to further provide machines or instruments, for example, the robot controller 44, devices necessary for an EFEM as the wafer transfer apparatus, materials 97 for maintenance and the like, in positions spaced away from the FOUP supporting portion 31.

Figure 15:
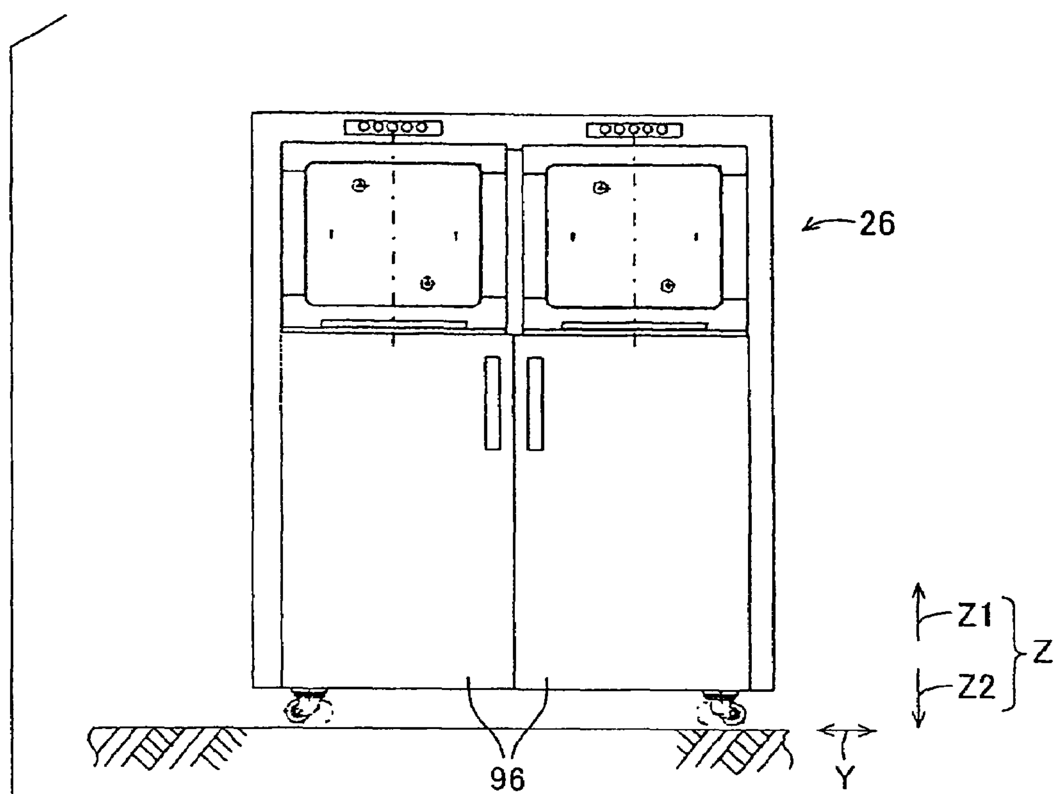
FIGS. 15(1) and 15(2) are diagrams showing a wafer transfer apparatus having a door 96 for use in maintenance, which is provided in a space defined below the opener 26.
Figure 15:
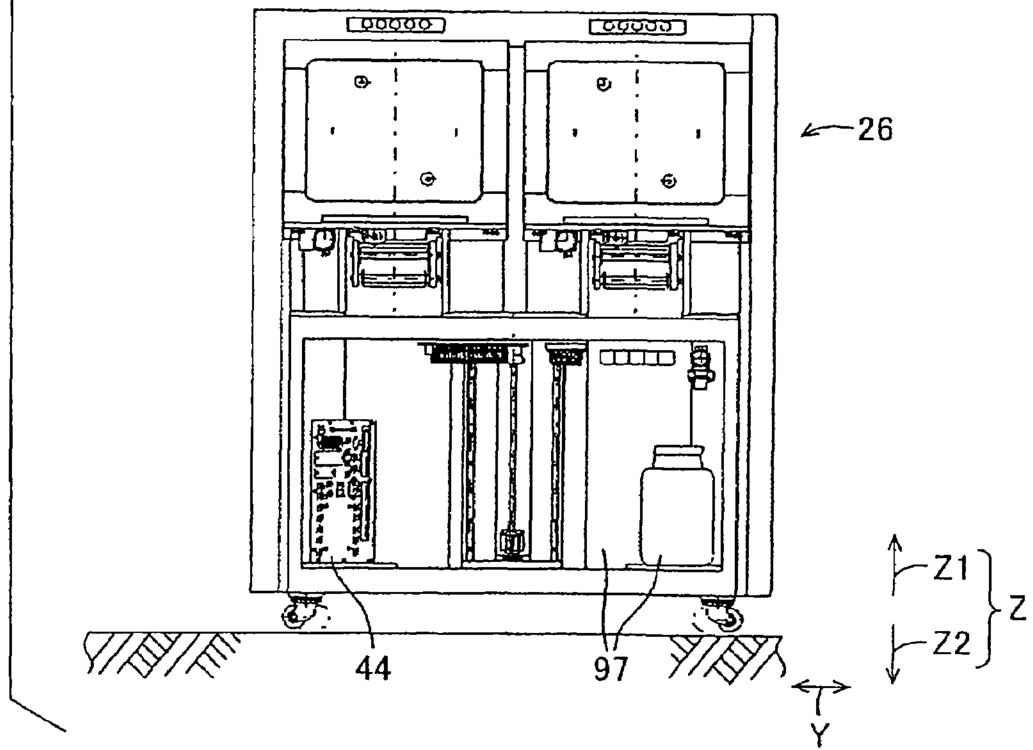

FIGS. 15(1) and 15(2) are diagrams showing a wafer transfer apparatus having a door 96 for use in maintenance, which is provided in a space defined below the opener 26. FIG. 15(1) shows a state in which the maintenance door 96 is closed, while FIG. 15(2) shows a state in which the maintenance door 96 is opened.

In this embodiment, in the space 76 provided below the openers 26, the robot controller 44, devices necessary for the EFEM, which is the wafer transfer apparatus, and maintenance materials 97 can be arranged. By opening the maintenance door 96, a worker can conduct adjustment and maintenance of the wafer transfer apparatus without entering the interface space 29 to the interior. Accordingly, contamination which can be attributed to the entering of the worker into the interface space 29 can be suppressed, and the time required for recovering the cleanliness in the interface space 29 can be reduced, thus enhancing the workability. In addition, since operational instruments required for mechanical adjustment and maintenance can be gathered in a space below the openers 26, works for adjustment and maintenance of the substrate transfer apparatus can be carried out with ease.

Figure 16:
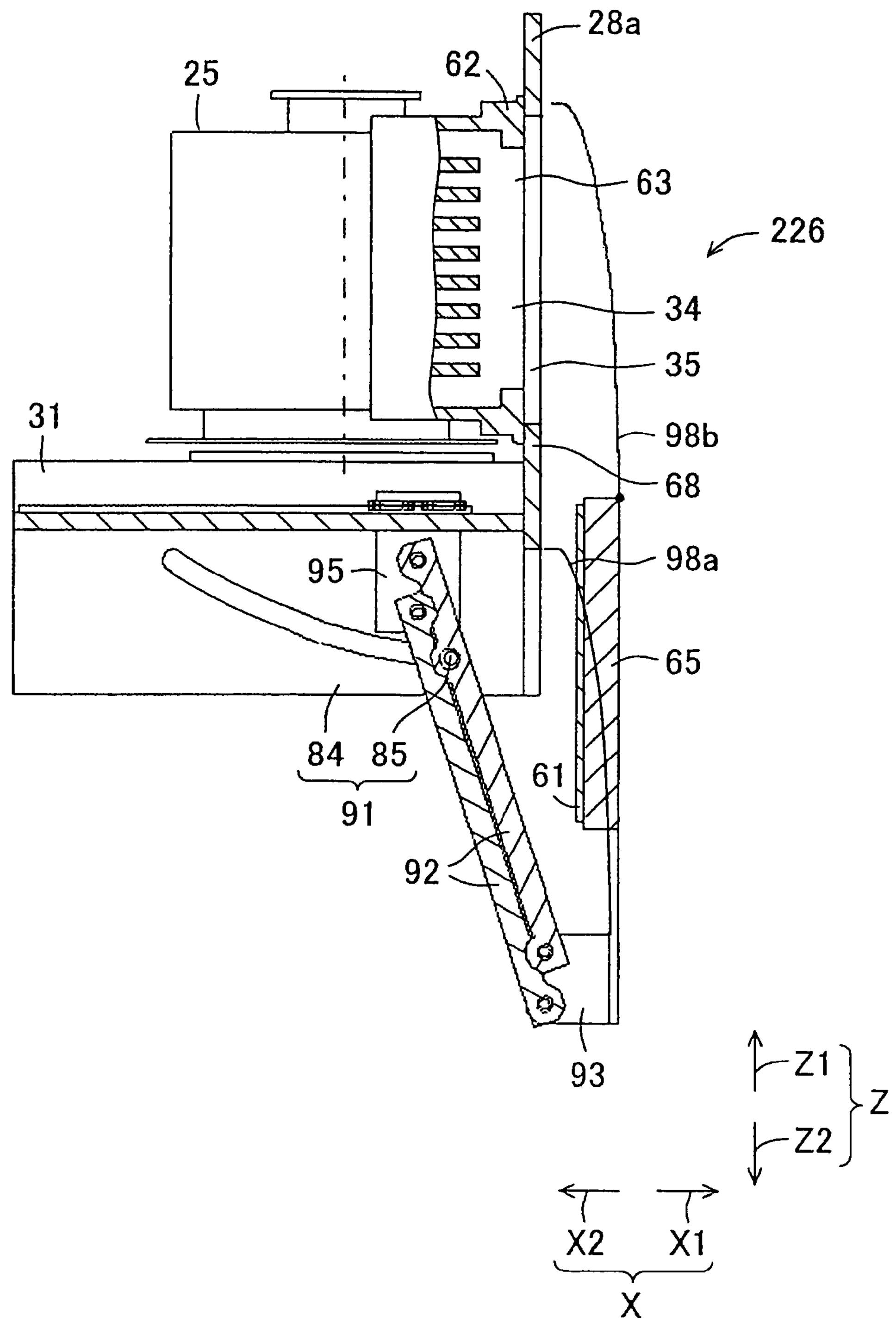
FIG. 16 is a diagram showing an opener 226 which is another embodiment of the present invention.

FIG. 16 is a diagram showing an opener 226 which is another embodiment of the present invention. The opener 226 is the same as that of the above-mentioned embodiment, except that the transfer track of the connector 93 is different. Like parts employed in the above-mentioned embodiment and also included in the opener 226 are designated by like reference numerals used in the above-mentioned embodiment and the description of their details are omitted.

While the openers 26 of the above-mentioned embodiment have been described, upon opening the FOUP, to move first the connector 93 in the horizontal direction and then move it in the downward direction Z2, the manner on opening is not limited to this aspect. For example, in this embodiment, the link member angular displacement means 91 controls the angle of the link members 92 such that the connector 93 is moved along a substantially horizontal curved track, while the movable body 93 is moved in the forward and backward directions X between the closing position P1 and the detaching position P2. In addition, the link member angular displacement means 91 controls the angle of the link members 92 such that the connector 93 is moved along a substantially vertical curved track, while the movable body 93 is moved in the forward and backward directions X over the evacuating region located in the forward direction X1 relative to the detaching position P2.

Specifically, when the movable body 95 is moved over the region C1 between the closing position P1 and the detaching position P2, the connector 93 is moved in the forward direction X1 as well as in the downward direction Z2. The directional components include the component of the forward direction X1 much more than the component of the downward direction Z2. When the movable body 95 is moved over the evacuating region C2 in the forward direction X1, the connector 93 is moved in the forward direction X1 as well as in the downward direction Z2. In this case, however, the directional components include the component of the forward direction X1 far less than the component of the downward direction Z2. As a result, the connector 93 in this embodiment is moved along an elliptic arc track. It can be understood that the transfer route of the connector 93 can be readily altered by setting the shape of the recess of each controlling portion 84.

Figure 17:
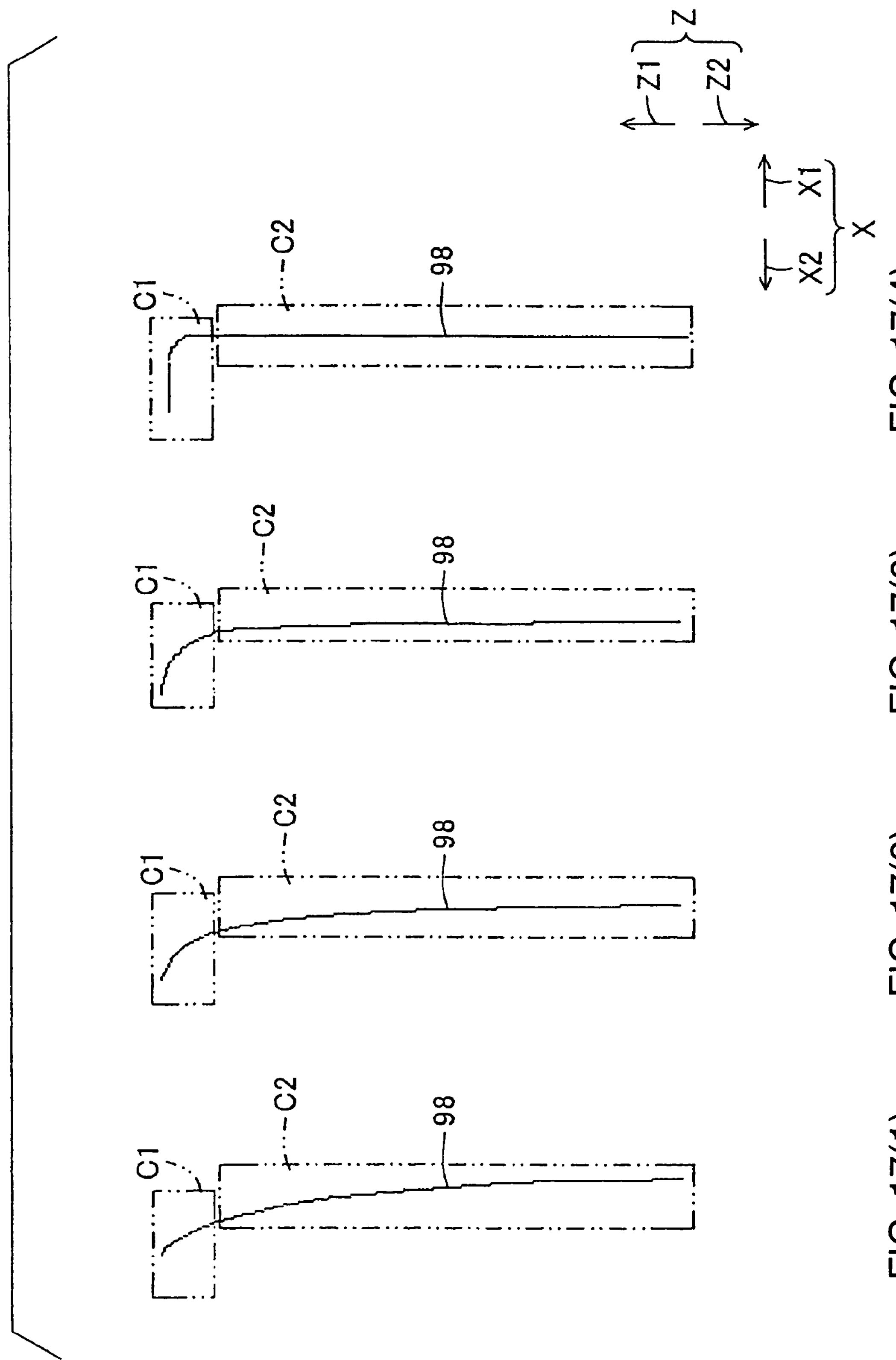
FIGS. 17(1) to 17(4) are diagrams showing examples of a transfer track 98 of a connector 93.

FIGS. 17(1) to 17(4) are diagrams showing examples of a transfer track 98 of the connector 93. FIG. 17(1) shows the transfer track 98 of the connector 93 of this embodiment, and FIG. 17(4) shows the transfer track 98 of the connector 93 of the above-mentioned embodiment. The track of the connector 93 may be changed into a curved line as in these embodiments, or may be changed into a broken line, or may be changed like a wave (not shown).

The link angular displacement means 91 controls the angular displacement of the link members 92 relative to the movable body 95 such that the components of the transfer direction of the connector 93 include at least components of the forward and backward directions X, while the movable body 95 is moved in the forward and backward directions X over the region C1 between the closing position P1 and the detaching position P2. In addition, the link angular displacement means 91 angularly displace the link members 92 relative to the movable body 95, along with the transfer of the movable body 95, such that the components of the transfer direction of the connector 93 include at least the components vertical to the forward and backward directions X, while the movable body 95 is moved in the forward and backward directions X over the evacuating region C2 located in the forward direction X1 relative to the detaching position P2. Consequently, interference of each door 61, 65 with the front face wall 28*a* can be prevented, and its undesired displacement in the forward direction X1 away from the front face wall 28*a* can also be prevented, thus providing a compact movable range of each door 61, 65 and enabling them to be moved in the interface space 29.

FIGS. 18(1) to 18(4) are diagrams showing a part of the link member angular displacement means 91 of another embodiment. In the embodiment previously described above, the link member angular displacement means 91 has a structure to control the angular displacement of the link member 92 by fitting the pin members 85 into the recesses 84. The present invention, however, is not limited to such an aspect. For example, as shown in FIG. 18(1), each controlling portion 185 may be formed of a rail member having a cylindrical shape with a uniform section, and each engaging portion 184 may be formed of a ring member configured to surround the rail member about its axis.

Alternatively, as shown in FIG. 18(2), each controlling portion 285 may be formed of a rail-like member including rail grooves formed in its opposite two faces, and each engaging portion 284 may include two members for holding the rail grooves of the controlling portion 285 on both sides. Otherwise, as shown in FIG. 18(3), each controlling portion 385 may be formed to have a curved top face because each door 61, 65 has a self-weight. In this way, each engaging portion 84, 184, 284, 384 can be guided by each controlling portion 85, 185, 285, 385 such that the displacement in the direction vertical to the forward and backward directions X can be prevented while they can be moved in the forward and backward directions, thus achieving the function as the link member angular displacement means 91.

In addition, as shown in FIG. 18(4), the link member angular displacement means 91 may be configured to include a motor adapted to angularly displace the link members 92 and a power transmission mechanism for transmitting the power of the motor to the link members 92. In this case, by angularly displacing the link members 92 in a predetermined amount using the motor in response to the transfer amount of the movable body 95, the same effect as described above can be obtained. With the angular displacement of the link members 92 due to the motor, the transfer route of the connector 93 in the case of opening the door can be made different from that in the case of closing the door.

Figure 19:
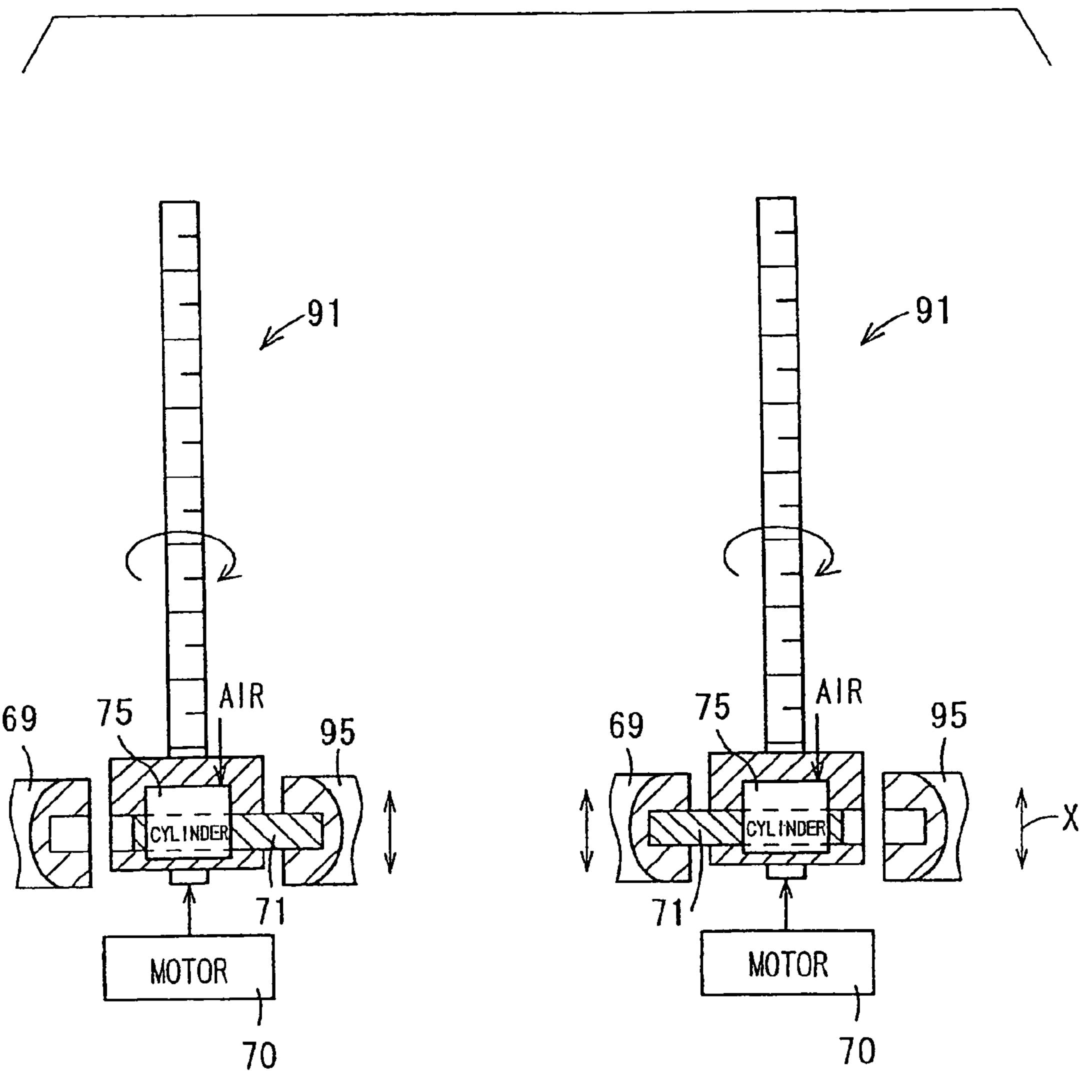
FIGS. 19(1) and 19(2) are diagrams showing the link member angular displacement means 91 of another embodiment, which is properly simplified.
Figure 20:
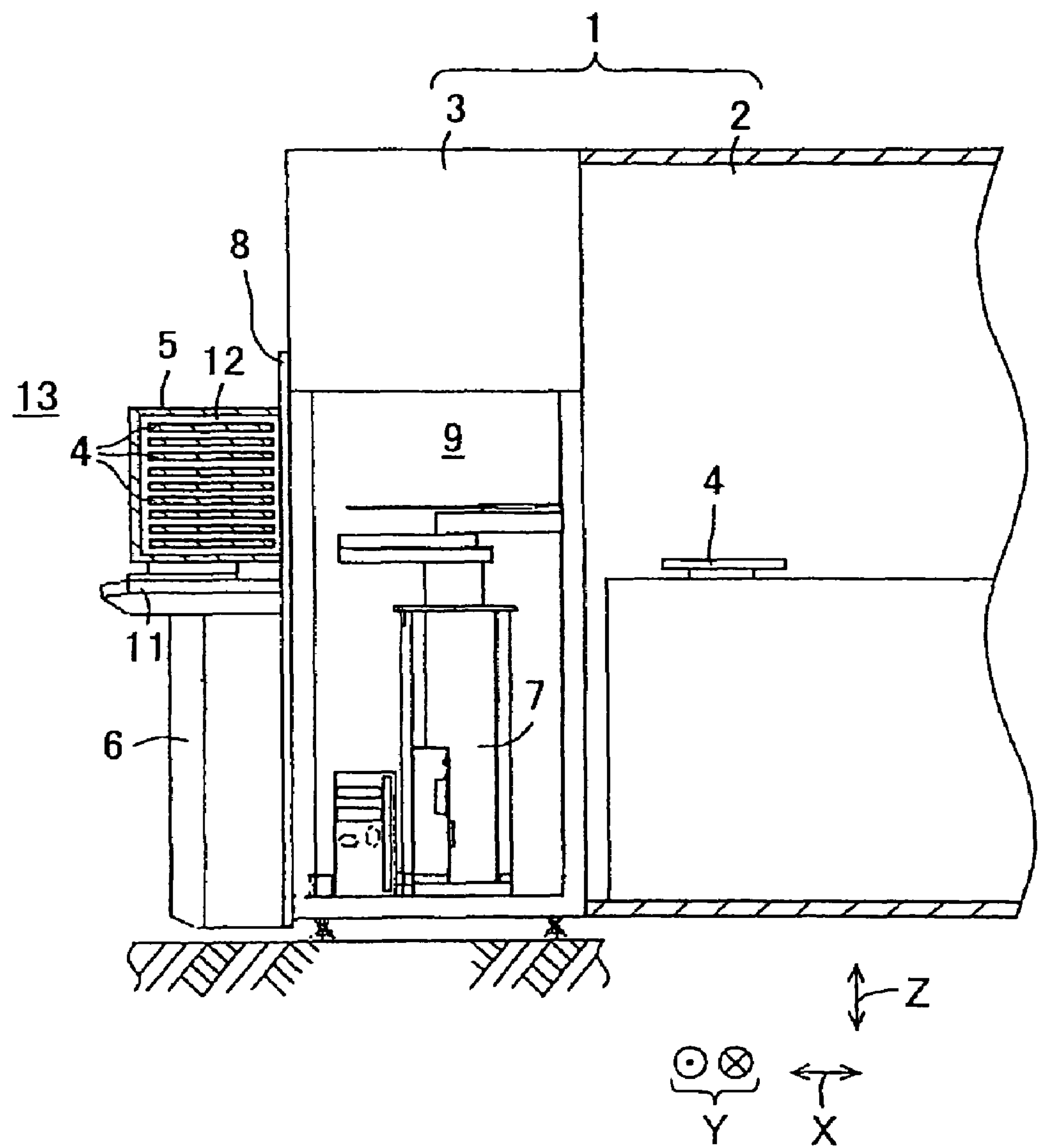
FIG. 20 is a section showing the related art semiconductor processing equipment 1, which is partly cut away.
Figure 21:
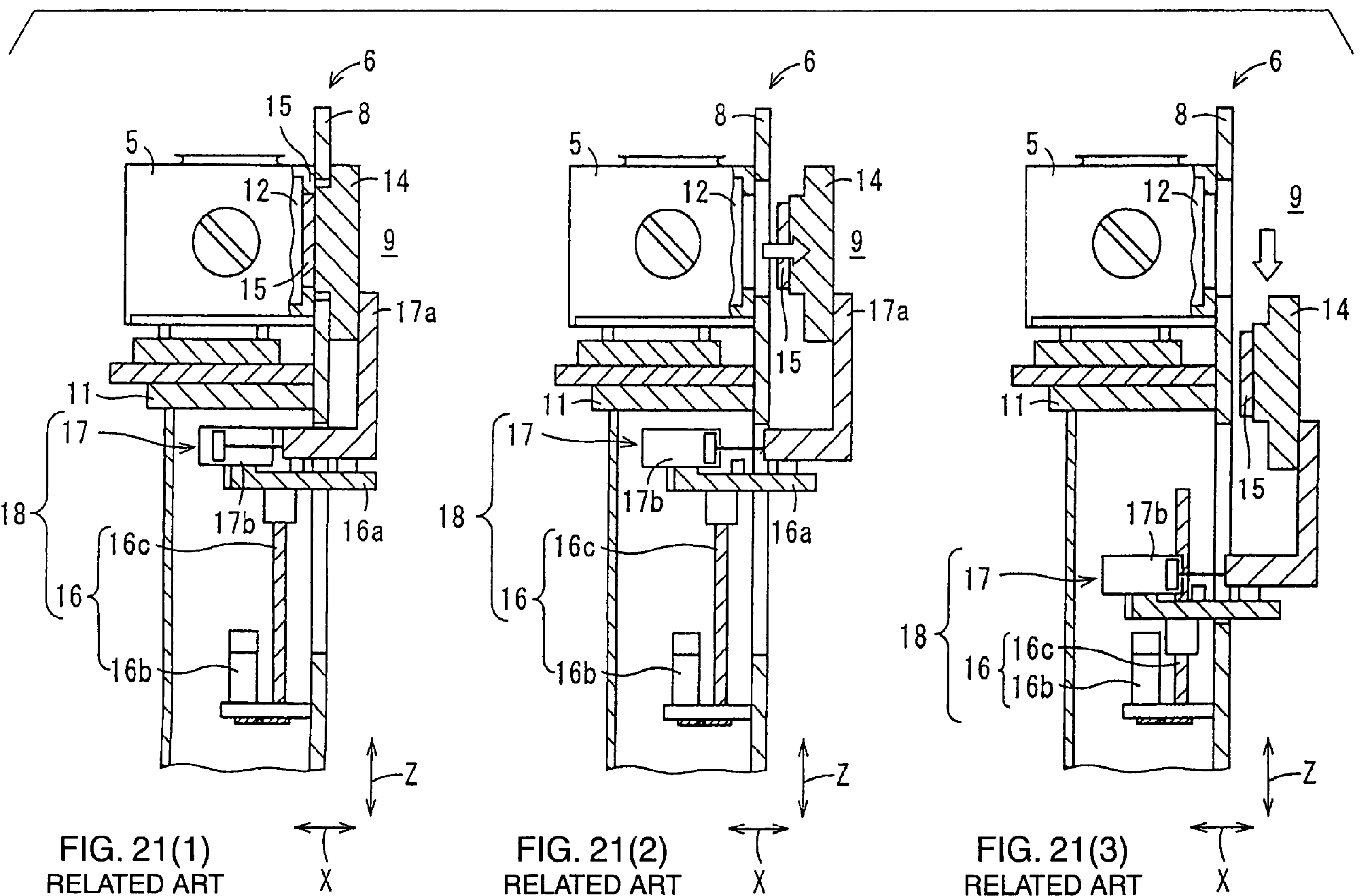
FIGS. 21(1) to 21(3) are sections showing the related art opener 6.

FIGS. 19(1) and 19(2) are diagrams showing the simplified movable body drive means 91 of another embodiment. Each opener 26 has the FOUP drive means 70 for driving the table portion 69, on which the FOUP supporting portion 31 is placed, in the forward and backward directions X. The FOUP drive means 70 is adapted to move the table portion 69, due to a robot or worker, in the forward and backward directions X toward the front face wall 28*a*, so as to bring the FOUP 25 into close contact with the front face wall 28*a*, while the FOUP 25 is arranged on the table portion 69 of the FOUP supporting portion 31. In addition, the FOUP drive means 70 releases the closely contacted state of the FOUP 25 with the front face wall 28*a*.

In this embodiment, since the table portion 69 and the movable body 95 can be moved in the same forward and backward directions X, each opener 26 includes a switching means 75 adapted to switch either operation of the table portion 69 or movable body 95. Namely, with a single drive means, the table portion 69 and the movable body 95 can be selectively moved in the forward and backward directions X.

For example, the drive means 70 moves a movable member 73 in the forward and backward directions X. On the movable member 73, a dual type air cylinder 75 is mounted, which can selectively project a pin portion 71 in two directions substantially vertical to the forward and backward directions X. As shown in FIG. 19(1), by projecting the pin portion 71 in a first direction due to the air cylinder 75 so as to fit the pin portion 71 into the movable body 95, the movable body 95 can be moved in the forward and backward directions X together with the movable member 73. Alternatively, as shown in FIG. 19(2), by projecting the pin portion 71 in a second direction due to the air cylinder 75 so as to fit the pin portion 71 into the table portion 69, the table portion 69 can be moved in the forward and backward directions X together with the movable member 73.

In this embodiment, since the movable body 95 can be provided in the vicinity of the FOUP supporting portion 31, a combined structure adapted to function as the movable body drive means as well as function as another drive means provided in the FOUP supporting portion 31 can be achieved. By providing the movable drive means by using a substrate container drive means adapted to move the FOUP 25 in the forward and backward directions X via the table portion 69, there is no need for employing two drive sources, i.e., a drive source for displacing and driving the movable body and another drive source for displacing and driving the substrate container, thus providing the substrate container drive means and the movable body drive means as a single drive source, thereby reducing the number of drive sources for the substrate container openers. In this manner, by employing another drive means provided in the FOUP supporting portion 31, which can also serve as the movable body drive means, the number of the drive means can be reduced, as such simplifying the structure as well as improving the degree of freedom in designing. In addition, the openers 26 can be downsized, thus also simplifying the structure.

The embodiment described above is illustrative only, and many modifications can be made without departing from the scope of this invention. For example, in this embodiment, while the semiconductor wafer 24 has been described as the substrate to be processed, the present invention can be applied to substrates other than semiconductor-wafers, for example, glass substrates for use in the flat panel displays (FPD) to obtain the same effect. With respect to the transfer track, those other than the tracks shown in FIGS. 17(1) to 17(4) are also contemplated. In addition, while the FOUP 25 has been employed as the substrate container, it may be a front opening shipping box (FOSB). In the embodiment described above, the movable body 95 does not have to be moved horizontally, provided that the connector 93 can be moved in the horizontal or substantially horizontal direction. In the embodiment described above, while the movable body 95 is arranged in the downward direction Z2 relative to the FOUP supporting portion 31, the movable body 95 may be disposed in the upward direction Z1 or in left and right directions Y, relative to the FOUP supporting portion 31. With respect to the link members 92, more than two link members may be used in order to constitute the parallel link mechanism. Additionally, each link member may be formed to be thin in the left and right directions, pass through a slit groove formed in a partition wall separating the interface space 29 from the internal space of the FOUP supporting portion 31, and extend over a region from the interface space 29 to the FOUP supporting portion 31.

Although the invention has been described in its preferred embodiments with a certain degree of particularity, obviously many changes and variations are possible therein. It is therefore to be understood that the present invention may be practiced otherwise than as specifically described herein without departing from the scope and spirit thereof.

What is claimed is:

1. An opener-side door drive mechanism, constituting a part of a substrate container opener for opening and closing a substrate container, the substrate container including a container main body configured to open in a preset front face direction and having a space for containing substrates therein, and a container-side door formed to be attached to and detached from the container main body and adapted to close an opening of the space for containing the substrates therein while being attached to the container main body, the opener-side door drive mechanism being configured to drive and displace an opener-side door capable of holding the container-side door which is removed from the container main body, the opener-side door drive mechanism comprising:

(a) a movable body configured to be movable in forward and backward directions X including a forward direction X1 corresponding to the front face direction with respect to the container main body positioned and supported by a container supporting portion constituting a part of the substrate container opener, and a backward direction X2 reverse to the forward direction X1;

(b) movable body drive means configured to drive and displace the movable body in the forward and backward directions X;

(c) a connector fixed to the opener-side door;

(d) a plurality of link members constituting a parallel link mechanism by connecting the movable body with the connector, the plurality of link members being interposed therebetween, wherein the connector is connected with the movable body such that the connector can be relatively and angularly displaced about an angular displacement axis L which extends vertically or substantially vertically to the forward and backward directions X; and (e) link member angular displacement means configured to angularly displace each of the link members relative to the movable body to predetermined angular positions corresponding to positions of the movable body along the forward and backward directions, the link member angular displacement means being configured to:

(e1) control the angular displacement of the link members relative to the movable body, such that components of transfer direction of the connector include at least components of the forward direction X1 under the condition that the movable body is moved in the forward direction X1 and components of the backward direction X2 under the condition that the movable body is moved in the backward direction X2, between a closing position, in which the movable body is located while the container-side door held by the opener-side door closes the opening of the container main body, and a detaching position, in which the movable body is moved by a preset distance A in the forward direction X1 from the closing position; and (e2) angularly displace the link members relative to the movable body along with a movement of the movable body, such that components of the transfer direction of the connector include at least directional components vertical to the forward and backward directions X, while the movable body is moved in the forward and backward directions X over an evacuating region located in the forward direction X1 relative to the detaching position.

2. The opener-side door drive mechanism according to claim 1, wherein the link member angular displacement means is configured to:

keep angles of the link members relative to the movable body constant or substantially constant, while the movable body is moved between the closing position and the detaching position; and increase the angles of the link members relative to the movable body, corresponding to the movement of the movable body in the forward direction X1, and decrease the angles of the link members relative to the movable body, corresponding to the movement of the movable body in the backward direction X2, while the movable body is moved over the evacuating region.

3. The opener-side door drive mechanism according to claim 2, wherein the forward and backward directions X and the angular displacement axis L extend horizontally or substantially horizontally, and wherein the link member angular displacement means is configured to angularly displace the link members in a downward direction relative to the movable body, corresponding to the movement of the movable body over the evacuating region in the forward direction X1, and angularly displace the link members in an upward direction relative to the movable body, corresponding to the movement of the movable body over the evacuating region in the backward direction X2.

4. The opener-side door drive mechanism according to claim 1, wherein the movable body drive means, the link member angular displacement means and the movable body are supported by the container supporting portion.

5. The opener-side door drive mechanism according to claim 1, wherein the link member angular displacement means comprises:

an engaging portion provided on at least any one of the link members; and a controlling portion configured to be engaged with the engaging portion so as to control angular positions of the engaging portion relative to the movable body corresponding to the positions of the movable body along the forward and backward directions.

6. The opener-side door drive mechanism according to claim 1, wherein the movable body drive means constitutes a part of the substrate container opener, and is configured to drive and displace the movable body in the forward and backward directions X, by utilizing a power of substrate container drive means configured to drive and displace the substrate container supported by the container supporting portion in the forward and backward directions X.

7. A substrate container opener comprising:

a front face wall having an opener opening formed to extend therethrough in a thickness direction;

a container supporting portion configured to locate and support a container main body in an attaching position where an opening of the container main body is in contact with the opener opening in the front face wall in a circumferential direction;

an opener-side door including an attaching and detaching mechanism which can attach and detach a container-side door relative to the container main body located and supported in the attaching position by the container supporting portion, the opener-side door further including a holding mechanism capable of holding the container-side door removed from the container main body, and the opener-side door being configured to close the opener opening; and the opener-side door drive mechanism according to claim 1, which can drive and displace the opener-side door holding the container-side door.

8. A substrate transfer apparatus configured to transfer a substrate relative to a substrate manufacturing apparatus for processing the substrate in a predetermined atmosphere, the substrate transfer apparatus comprising the substrate container opener according to claim 7.

9. The opener-side door drive mechanism according to claim 1, wherein the plurality of link members define a distance therebetween, and as the movable body is moved in the forward direction X1 in the evacuating region, the distance between the plurality of link members is decreased, and as the movable body is moved in the backward direction X2 in the evacuating region, the distance between the plurality of link members is increased.

* * * * *